(12) United States Patent
Yoshimura et al.

(10) Patent No.: US 9,322,529 B2
(45) Date of Patent: Apr. 26, 2016

(54) LIGHT EMITTING DEVICE

(75) Inventors: Kenichi Yoshimura, Osaka (JP); Kohsei Takahashi, Osaka (JP); Hiroshi Fukunaga, Osaka (JP); Masatsugu Masuda, Osaka (JP)

(73) Assignee: SHARP KABUSHIKI KAISHA, Osaka-shi, Osaka (JP)

( * ) Notice: Subject to any disclaimer, the term of this patent is extended or adjusted under 35 U.S.C. 154(b) by 142 days.

(21) Appl. No.: 14/122,683

(22) PCT Filed: Apr. 2, 2012

(86) PCT No.: PCT/JP2012/058861
§ 371 (c)(1),
(2), (4) Date: Nov. 27, 2013

(87) PCT Pub. No.: WO2012/165032
PCT Pub. Date: Dec. 6, 2012

(65) Prior Publication Data
US 2014/0233209 A1     Aug. 21, 2014

(30) Foreign Application Priority Data

May 31, 2011 (JP) ................... 2011-121811

(51) Int. Cl.
*F21V 9/16*       (2006.01)
*H01L 33/50*      (2010.01)
*C09K 11/77*      (2006.01)

(52) U.S. Cl.
CPC .............. *F21V 9/16* (2013.01); *C09K 11/7728* (2013.01); *C09K 11/7774* (2013.01); *H01L 33/504* (2013.01); *H01L 2224/48091* (2013.01); *H01L 2224/73265* (2013.01)

(58) Field of Classification Search
CPC ........................................................ F21V 9/16
See application file for complete search history.

(56) References Cited

U.S. PATENT DOCUMENTS

2006/0038477 A1   2/2006  Tamaki et al.
2006/0091790 A1   5/2006  Nagatomi et al.
(Continued)

FOREIGN PATENT DOCUMENTS

EP      2 541 630 A1    1/2013
JP      2003-321675    11/2003
(Continued)

OTHER PUBLICATIONS

International Search Report for PCT/JP2012/058861 mailed May 15, 2012.

*Primary Examiner* — Tracie Y Green
(74) *Attorney, Agent, or Firm* — Nixon & Vanderhye, P.C.

(57) ABSTRACT

Provided is a light emitting device with effectively improved color rendering properties. A light emitting device 1 includes: a light source 2 that emits light having the maximum intensity at a predetermined wavelength; a first phosphor (yellow phosphor) 51 that absorbs the light emitted by the light source 2 and outputs fluorescent light having the maximum intensity at a first wavelength which is longer than the predetermined wavelength; and a second phosphor (red phosphor) 52 that absorbs the light emitted by the light source 2 and outputs fluorescent light having the maximum intensity at a second wavelength which is longer than the first wavelength. An absolute value of wavelength dependency of an optical absorption rate of the second phosphor 52 at the first wavelength is set to not more than 0.6%/nm. Accordingly, the color rendering properties of the light emitted by the light emitting device 1 can be effectively improved.

14 Claims, 15 Drawing Sheets

(56) References Cited

U.S. PATENT DOCUMENTS

2006/0197432 A1   9/2006  Nagatomi et al.
2007/0259206 A1  11/2007  Oshio
2008/0149957 A1   6/2008  Kameshima et al.
2010/0207511 A1   8/2010  Harada
2012/0112626 A1   5/2012  Sakuta et al.

FOREIGN PATENT DOCUMENTS

| | | |
|---|---|---|
| JP | 2006-49799 | 2/2006 |
| JP | 2006-124501 | 5/2006 |
| JP | 2006-241249 | 9/2006 |
| JP | 2008-270781 | 11/2008 |
| WO | WO 2006/077740 | 7/2006 |
| WO | WO 2011/024818 | 3/2011 |
| WO | WO 2011/024818 A1 | 3/2011 |

Fig. 7

|  | Peak wavelength of a light source (nm) | Manufacturing method for red phosphor | Translucent resin /Phosphor (mass ratio) | Red phosphor /Yellow phosphor (mass ratio) |
|---|---|---|---|---|
| Example 1 | 450 | First manufacturing example | 11.80 | 0.46 |
| Example 2 | 450 | Second manufacturing example | 13.05 | 0.47 |
| Example 3 | 460 | First manufacturing example | 12.40 | 0.51 |
| Example 4 | 460 | Second manufacturing example | 13.81 | 0.52 |
| Comparative Example 1 | 450 | First comparative manufacturing example | 11.80 | 0.48 |
| Comparative Example 2 | 450 | Second comparative manufacturing example | 12.55 | 0.41 |
| Comparative Example 3 | 460 | First comparative manufacturing example | 12.49 | 0.53 |
| Comparative Example 4 | 460 | Second comparative manufacturing example | 13.33 | 0.44 |

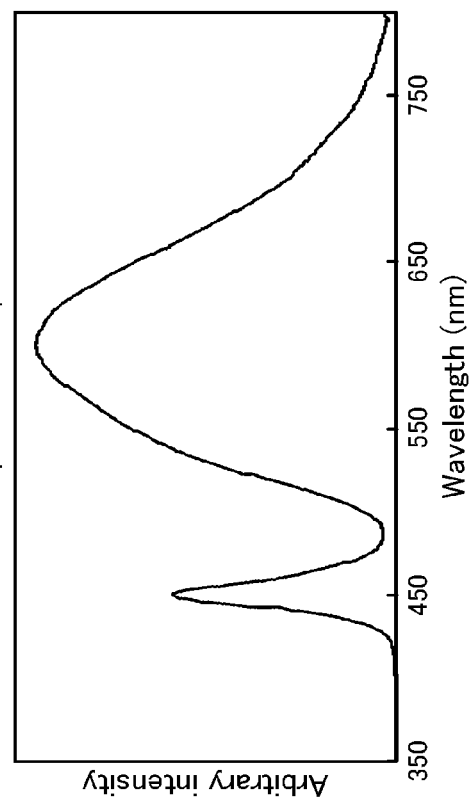
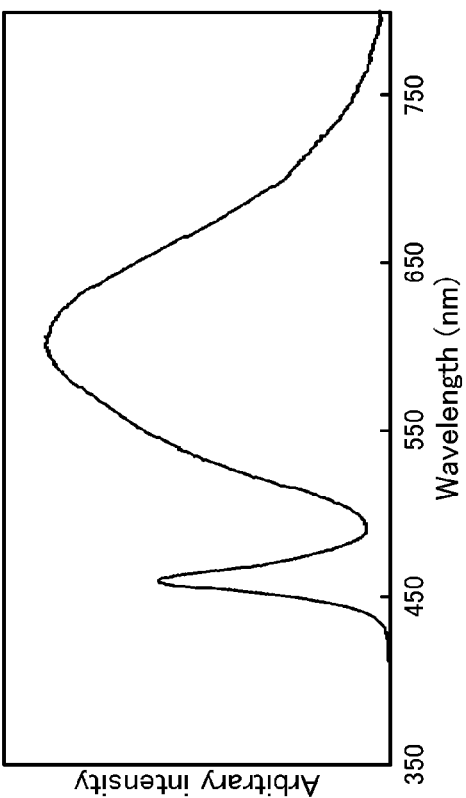
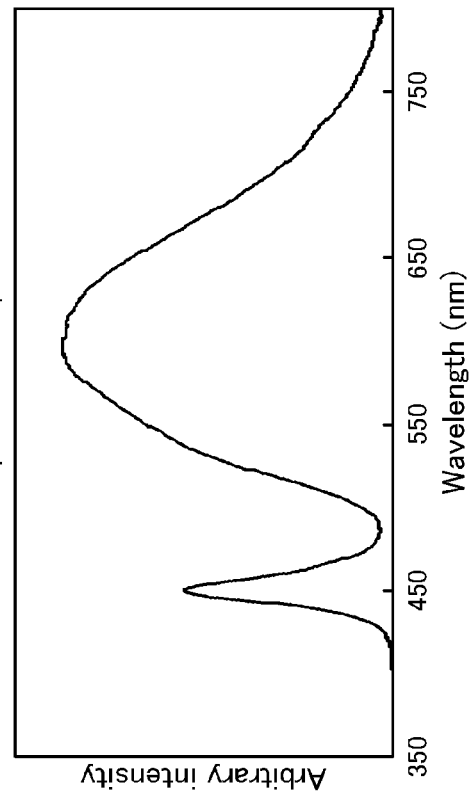
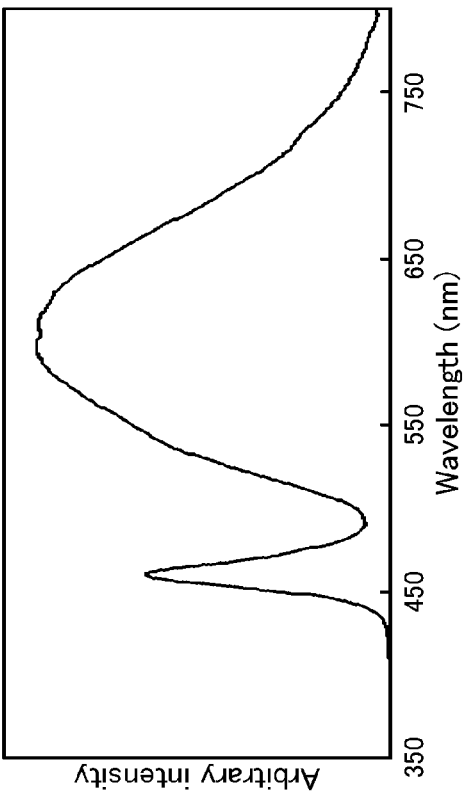
Fig. 9A Comparative example 1
Fig. 9B Comparative example 2
Fig. 9C Comparative example 3
Fig. 9D Comparative example 4

Fig. 10A

| | Peak wavelength of a light source (nm) | Ra | R9 | TCP | Duv | x | y |
|---|---|---|---|---|---|---|---|
| Example 1 | 450 | 78.9 | 34.5 | 2809.8 | 0.0 | 0.451 | 0.408 |
| Example 2 | 450 | 76.7 | 21.6 | 2800.6 | −0.1 | 0.452 | 0.408 |
| Comparative example 1 | 450 | 74.4 | 10.2 | 2797.3 | −0.1 | 0.452 | 0.408 |
| Comparative example 2 | 450 | 73.2 | 1.6 | 2804.4 | 0.0 | 0.452 | 0.409 |

Fig. 10B

| | Peak wavelength of a light source (nm) | Ra | R9 | TCP | Duv | x | y |
|---|---|---|---|---|---|---|---|
| Example 3 | 460 | 82.8 | 42.8 | 2807.1 | 0.2 | 0.452 | 0.409 |
| Example 4 | 460 | 80.4 | 29.8 | 2800.4 | −0.1 | 0.452 | 0.408 |
| Comparative Example 3 | 460 | 77.8 | 17.9 | 2802.9 | 0.1 | 0.452 | 0.409 |
| Comparative Example 4 | 460 | 76.5 | 8.9 | 2802.4 | 0.2 | 0.452 | 0.409 |

LIGHT EMITTING DEVICE

CROSS-REFERENCE TO RELATED APPLICATIONS

This application is a National Phase filing under 35 U.S.C. §371 of International Application No. PCT/JP2012/058861 filed on Apr. 2, 2012, and which claims priority to Japanese Patent Application No. 2011-121811 filed on May 31, 2011.

TECHNICAL FIELD

The present invention relates to a light emitting device provided with a light source and a phosphor that absorbs light emitted by the light source and outputs fluorescent light.

BACKGROUND ART

A light emitting device using an element represented by an LED (Light Emitting Diode) and the like has recently been used in a variety of applications since having advantages of low power consumption, a small size, high luminance and a long lifetime. In particular, attention is being focused on its application to an illumination device that is replaced for an incandescent lamp and the like with large power consumption.

Generally, making the element such as the LED emit white light is difficult, differently from the incandescent lamp. For this reason, the light emitting device using such an element further includes a phosphor, which absorbs light emitted by the element and outputs fluorescent light, and the device emits white light by mixture of the light emitted by the element and the light outputted by the phosphor. For example, there has already been widespread a light emitting device including an LED that emits blue light and a phosphor that outputs yellow fluorescent light.

However, the white (mixed color of blue and yellow) light emitted by the above light emitting device has a smaller red component (is cool-color light) as compared with the white (white generated by radiation and close to natural light) light outputted by the incandescent lamp and the like. For this reason, it is difficult to make such a light emitting device emit white light which is warm-color light required for example for a household illumination device and the like.

Therefore, for example in Patent Document 1, there is provided a light emitting device where an LED that emits blue light and a phosphor that outputs yellow fluorescent light are further added with a phosphor that outputs red fluorescent light, to emit white light replenished with a red component.

PRIOR ART DOCUMENT

Patent Document

Patent Document 1: Japanese Patent Application Laid-Open No. 2006-124501

DISCLOSURE OF THE INVENTION

Problems to be Solved by the Invention

As thus described, color rendering properties of light emitted by the light emitting device can be improved by further providing the phosphor capable of outputting fluorescent light of a color in short in the light emitting device. However, such simple mixture of colors by just replenishing a color component in short cannot sufficiently improve color rendering properties, which is thus problematic.

In view of the above problem, it is an object of the present invention to provide a light emitting device with effectively improved color rendering properties.

Means for Solving the Problem

In order to achieve the above object, the present invention provides a light emitting device including: a light source that emits light having the maximum intensity at a predetermined wavelength;
a first phosphor that absorbs the light emitted by the light source and outputs fluorescent light having the maximum intensity at a first wavelength which is longer than the predetermined wavelength; and
a second phosphor that absorbs the light emitted by the light source and outputs fluorescent light having the maximum intensity at a second wavelength which is longer than the first wavelength, wherein
an absolute value of wavelength dependency of an optical absorption rate of the second phosphor at the first wavelength is not more than 0.6%/nm.

For example, the wavelength dependency of the optical absorption rate of the second phosphor at the first wavelength can be obtained as an inclination of the optical absorption rate with respect to the wavelength.

Further, in the light emitting device having the above characteristics, it is preferable that the predetermined wavelength be not shorter than 420 nm and not longer than 480 nm,
the first wavelength be not shorter than 500 nm and not longer than 580 nm, and
the second wavelength be not shorter than 600 nm and not longer than 680 nm.

Further, in the light emitting device having the above characteristics, it is preferable that the absolute value of the wavelength dependency of the optical absorption rate of the second phosphor at the first wavelength be not more than 0.4%/nm.

Further, in the light emitting device having the above characteristics, it is preferable that, when a shorter wavelength is represented by $\lambda s$ and a longer wavelength is represented by $\lambda l$ out of wavelengths at which intensities are one-half of the intensity at the first wavelength as to the fluorescent light outputted by the first phosphor, and
an optical absorption rate of the second phosphor at a certain wavelength $\lambda$ is represented by $RAbs(\lambda)$,
$RAbs(\lambda l)/RAbs(\lambda s)$ be larger than 0.21.

Further, in the light emitting device having the above characteristics, it is preferable that $RAbs(\lambda l)/RAbs(\lambda s)$ be larger than 0.24.

Further, in the light emitting device having the above characteristics, it is preferable that the first phosphor be a YAG phosphor added with Ce as an activator, and the second phosphor be a $CaAlSiN_3$ phosphor added with Eu as an activator.

Further, in the light emitting device having the above characteristics, it is preferable that a matrix of the second phosphor be represented by a composition formula of $(Ca_{1-c}Eu_cAlSiN_3)_{1-b}(Si_2N_2O)_b$.

Further, in the light emitting device having the above characteristics, it is preferable that a value of b in the composition formula of $(Ca_{1-c}Eu_cAlSiN_3)_{1-b}(Si_2N_2O)_b$ of the matrix of the second phosphor be not smaller than 0 and not larger than 0.4.

Effect of the Invention

As described later, concentrated studies by the inventors of the present invention have found that the color rendering properties of the light emitting device can be effectively improved by making small the wavelength dependency of the optical absorption rate of the second phosphor in a fluorescent light region of the first phosphor. The light emitting device having the above characteristics has color rendering properties effectively improved by making small the wavelength dependency of the optical absorption rate of the second phosphor in the fluorescent light region of the first phosphor.

BRIEF DESCRIPTION OF THE DRAWINGS

FIG. 7 is a table explaining Examples 1 to 4 and Comparative Examples 1 to 4.

FIG. 9A though FIG. 9D comprise graphs showing properties of light emitting devices in comparative Examples 1 to 4.

FIG. 10A and FIG. 10B comprise tables showing, as comparing, the properties of the light emitting devices in Examples 1 to 4 and the properties of the light emitting devices in Comparative Examples 1 to 4.

MODE FOR CARRYING OUT THE INVENTION

<<Schematic Structural Example of Light Emitting Device>>

Figure 1:
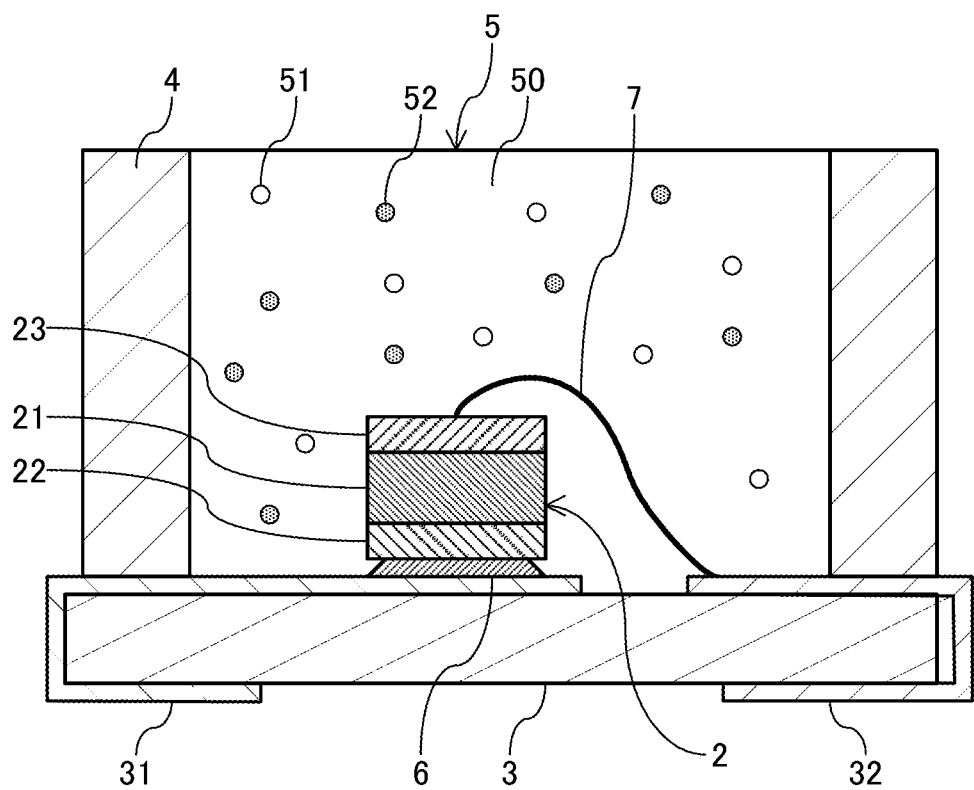
FIG. 1 is a sectional view showing an example of a schematic structure of a light emitting device according to an embodiment of the present invention.

First, an example of a schematic structure of a light emitting device according to an embodiment of the present invention will be described with reference to FIG. 1. FIG. 1 is a sectional view showing an example of a schematic structure of a light emitting device according to an embodiment of the present invention.

As shown in FIG. 1, a light emitting device 1 includes: a light source 2 made up of an LED; a substrate 3 whose upper surface is provided with the light source 2; a frame 4 which is provided on the upper surface of the substrate 3 and whose inside is arranged with the light source 2; a mold portion 5 which fills the inside of the frame 4; and conductive adhesive 6 and wire 7 which electrically connect between the light source 2 and the substrate 3.

The light source 2 is provided with a semiconductor layer 21 including, for example, InGaN as an active layer, and a p-side electrode 22 and an n-side electrode 23 which hold the semiconductor device therebetween. The substrate 3 is made up of, for example, a print substrate, and a p-electrode portion 31 and an n-electrode portion 32 are formed from the upper surface and the lower surface thereof. The p-side electrode 22 and the p-electrode portion 31 are attached and electrically connected to each other by the adhesive 6. Further, the n-side electrode 23 and the n-electrode portion 32 are electrically connected to each other by the wire 7. As thus described, the inside of the frame 4 is filled with the mold portion 5 in the state where the substrate 3 and the light source 2 are electrically connected to each other, to seal the light source 2.

The light source 2 is excited by electric power supplied through the p-electrode portion 31 and the adhesive 6 or the n-electrode portion 32 and the wire 7, and emits blue light (light with the maximum intensity at a wavelength, namely a peak wavelength, being not shorter than 420 nm and not longer than 480 nm, and the same shall apply hereinafter). A yellow phosphor 51 absorbs the blue light emitted by the light source 2 and outputs yellow fluorescent light (light with a peak wavelength of not shorter than 500 nm and not longer than 580 nm, and the same shall apply hereinafter). A red phosphor 52 absorbs the blue light emitted by the light source 2 and outputs red fluorescent light (light with a peak wavelength of not shorter than 600 nm and not longer than 680 nm, and the same shall apply hereinafter).

The light source 2 is not restricted to the aforementioned LED, but a variety of known elements that can emit blue light, such as an LD (Laser Diode) and an inorganic EL (electroluminescence) element, are applicable. For example, an LED as a commercial product (e.g., one produced by Cree, Inc.) is applicable to the aforementioned light source 2.

The mold portion 5 is provided with: a translucent resin (e.g. silicon resin, epoxy resin, etc.) 50; a phosphor (hereinafter referred to as a yellow phosphor) 51 that is dispersed in the translucent resin 50, absorbs the light emitted by the light source 2 (or excited by the light), and outputs yellow fluorescent light; and a phosphor (hereinafter referred to as a red phosphor) 52 that is dispersed in the translucent resin 50, absorbs the light emitted by the light source 2 (or excited by the light), and outputs red fluorescent light. Any method may be used as a method for dispersing the yellow phosphor 51 and the red phosphor 52 into the translucent resin 50, and a known method is applicable.

A mixed ratio of the translucent resin 50, the yellow phosphor 51 and the red phosphor 52 is appropriately selectable in accordance with a color of light intended to be emitted (e.g. white which is a warm color close to natural light like one emitted by the incandescent lamp). Specifically, for example, the mixed ratio may be decided such that a mass ratio of the translucent resin 50 with respect to the yellow phosphor 51 and the red phosphor 52 (mass of translucent resin 50/total mass of yellow phosphor 51 and red phosphor 52) is within a range of not less than 5 and not more than 50. Further, for example, the mixed ratio may be decided such that a mass ratio of the red phosphor 52 with respect to the yellow phosphor 51 (mass ratio of red phosphor 52/yellow phosphor 51) is within a range of not less than 0.1 and not more than 1.

It is to be noted that the light emitting device 1 according to the embodiment of the present invention described above is merely an example, and the present invention is naturally applicable to a light emitting device with a different structure. However, the aforementioned light emitting device 1 will be assumed hereinafter so long as no particular remark is made for the sake of embodying descriptions.

<<Manufacturing Method for Yellow Phosphor and Red Phosphor>>

An example of a manufacturing method for the yellow phosphor and the red phosphor will be described in detail with reference to the drawings. However, part of the examples of the manufacturing method mentioned hereinafter (especially an example of the manufacturing method by which the yellow phosphor and the red phosphor provided in Examples of the light emitting device can be manufactured) is merely an example of the manufacturing method applicable to the light emitting device of the present invention, and the light emitting device of the present invention is not restricted to a light emitting device obtained by that example of the manufacturing method.

<Manufacturing Method for Yellow Phosphor (Provided in Examples and Comparative Examples of the Light Emitting Device)>

For example, a YAG phosphor (a phosphor containing one with a composition formula of $Y_3Al_5O_{12}$ (including substances obtained by replacing part or all of Y, Al and O with predetermined elements), and the same shall apply hereinafter) added with Ce as an activator can be used for the yellow phosphor. Specifically, for example, a phosphor with a composition formula of $Y_{3-a}Ce_aAl_5O_{12}$ can be used for the yellow phosphor. The yellow phosphor is obtained for example by a common manufacturing example which will be described hereinafter. It is to be noted that the common manufacturing example which will be described hereinafter is capable of manufacturing the yellow phosphor provided in each of undermentioned Examples and Comparative Examples of the light emitting device.

[Common Manufacturing Example]

The common manufacturing example is to manufacture a yellow phosphor with a composition formula of $Y_{3-a}Ce_aAl_5O_{12}$, where a=0.065. In the common manufacturing example, first, 86.1 mass % of a yttrium oxide power, 2.1 mass % of a cerium oxide powder, 11.8 mass % of an aluminum oxide powder and predetermined amounts of calcium fluoride and ammonium hydrogen phosphate as a flux are weighted, and then mixed by a tumbling ball mill formed using an agate-made ball and a nylon pot. Next, a quartz crucible is filled with the obtained mixture and in a reducing atmosphere made up of 95 vol % of nitrogen and 5 vol % of hydrogen, it is held at 1550° C. for 10 hours. Then, the obtained burned substance is ground by an agate-made mortar, to obtain a powdery yellow phosphor.

Figure 2:
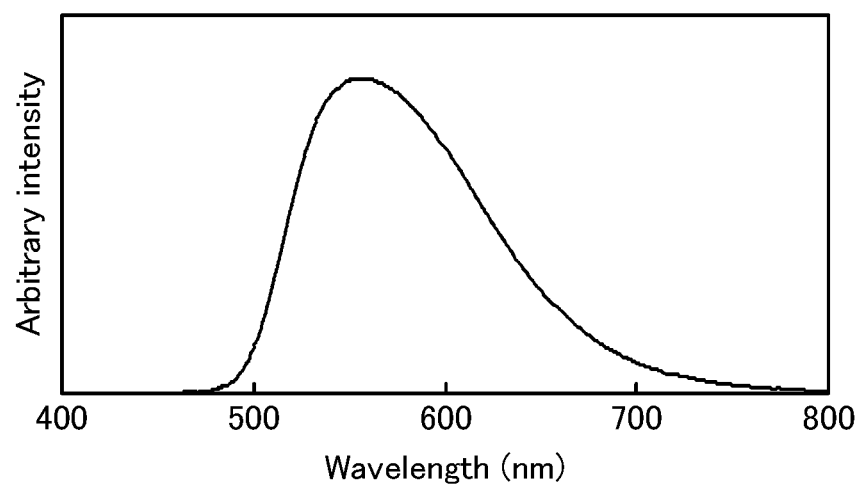
FIG. 2 is a graph showing properties of a yellow phosphor obtained by a common manufacturing example.

Properties of the yellow phosphor obtained by the common manufacturing example will be described with reference to FIG. 2. FIG. 2 is a graph showing properties of the yellow phosphor obtained by the common manufacturing example. The graph shown in FIG. 2 represents a fluorescence spectrum in the case of irradiating the yellow phosphor with light (blue light) having a peak wavelength of 450 nm, where a horizontal axis indicates a wavelength (nm) and a vertical axis indicates an intensity (normalized by an arbitrary intensity).

As shown in FIG. 2, the yellow phosphor obtained by the common manufacturing example absorbs blue light and outputs yellow fluorescent light with a peak wavelength of 558 nm and a half width of 115 nm. When a shorter wavelength is represented by λs (the same shall apply hereinafter) and a longer wavelength is represented by λl (the same shall apply hereinafter) out of wavelengths at which intensities are one-half of the intensity at the peak wavelength as to the fluorescent light outputted by the yellow phosphor, λs=515 nm and λl=630 nm. Further, chromaticity coordinates of a fluorescence spectrum of the yellow phosphor are: (x, y)=(0.447, 0.534).

<Manufacturing Method for Red Phosphor (Provided in Examples of Light Emitting Device)>

For example, a $CaAlSiN_3$ phosphor (a phosphor containing one with a composition formula of $CaAlSiN_3$ (including substances obtained by replacing part or all of Ca, Al, Si and N with predetermined elements), and the same shall apply hereinafter) added with Eu as the activator can be used for the red phosphor. Specifically, for example, a phosphor with a composition formula of $(Ca_{1-c}Eu_cAlSiN_3)_{1-b}(Si_2N_2O)_b$ can be used for the red phosphor. The red phosphor is obtained for example by a first manufacturing example and a second manufacturing example which will be described hereinafter. It is to be noted that the first manufacturing example and the second manufacturing example which will be described hereinafter are capable of manufacturing the red phosphor provided in undermentioned Examples of the light emitting device.

[First Manufacturing Example]

The first manufacturing example is to manufacture a red phosphor of $(Ca_{1-c}Eu_cAlSiN_3)_{1-b}(Si_2N_2O)_b$, where b=0 and c(1−b)=0.008.

First, 29.7 mass % of an aluminum nitride power, 33.9 mass % of an α-type silicon nitride powder, 35.5 mass % of a calcium nitride powder and 1.0 mass % of a europium nitride powder are weighted, and then mixed using a mortar and a pestle made of a silicon nitride burned substance for not shorter than 10 minutes. In addition, this europium nitride is obtained by performing nitridation synthesis on metal europium in ammonia.

Next, the obtained powder aggregate is naturally dropped into a pot made of boron nitride having a size with a diameter of 20 mm and a height of 20 mm, to fill the pot. It is to be noted that the processes up to here (weighing, mixing and shaping of the powder materials) are performed in a globe box for holding a nitrogen atmosphere with moisture of not more than 1 ppm and oxygen of not more than 1 ppm.

The pot filled with the powder aggregate is heated in a nitrogen atmosphere of 99.999 vol % and 1 MPa by use of a graphite-resistance heating electric furnace. At this time, the temperature is increased up to 1800° C. at a programming rate of 500° C. per hour, and is further held at 1800° C. for two hours. Then, the obtained burned substance is ground by an agate-made mortar, to obtain a powdery red phosphor.

The powder of the red phosphor obtained as described above has a crystal structure where a $CaAlSiN_3$ phase with a structure of $CaAlSiN_3$ crystal is a principal phase (phase existing in the largest amount, specifically a phase existing in an amount of not smaller than 50 mass %, for example, and the same shall apply hereinafter). It is to be noted that the crystal structure was confirmed by powder X-ray diffraction (XRD) measurement using a Cu—Kα ray. Further, when the red phosphor powder was irradiated with light with a wavelength of 450 nm, output of red fluorescent light was confirmed.

Figure 3A:
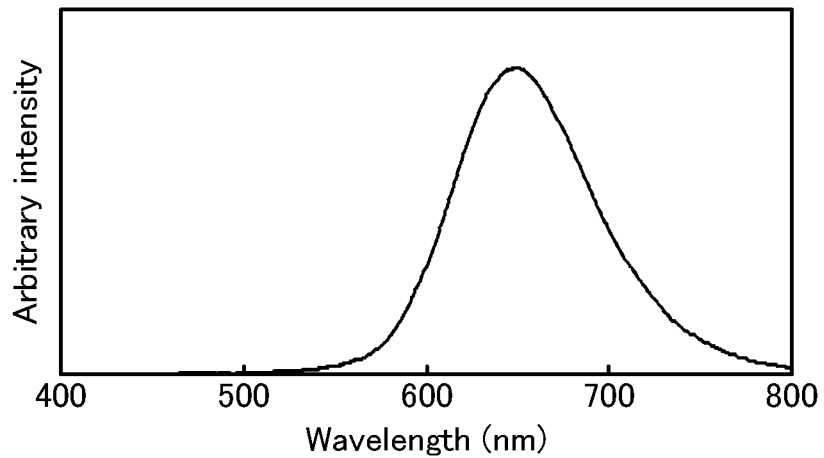
FIG. 3A and FIG. 3B comprise graphs showing properties of a red phosphor obtained by a first manufacturing example.
Figure 3B:
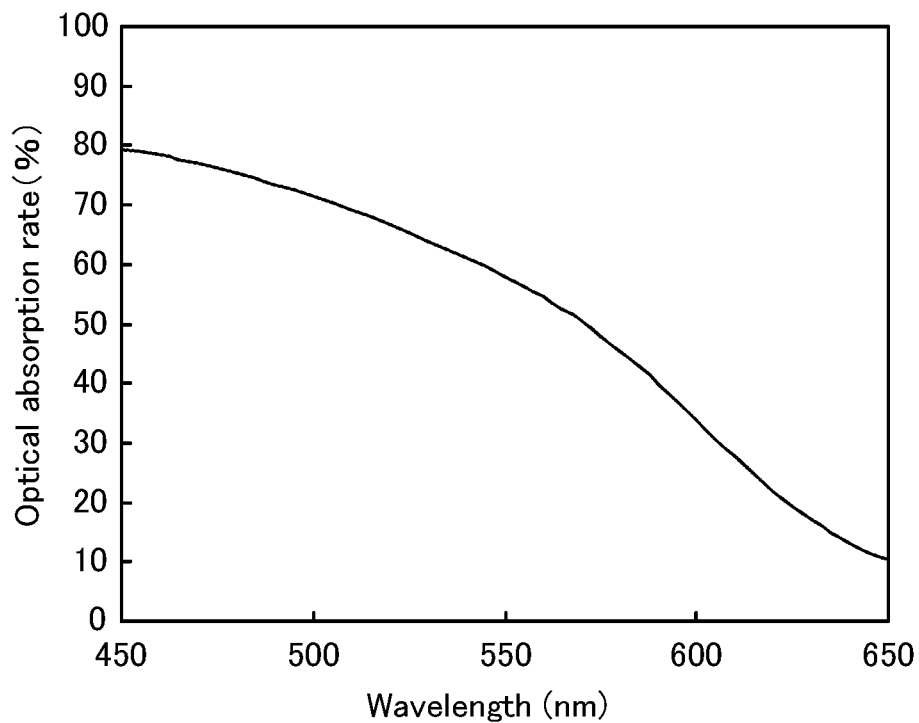

Fluorescent properties of the red phosphor obtained by the first manufacturing example will be described with reference to FIG. 3. FIG. 3 includes graphs showing properties of the red phosphor obtained by the first manufacturing example. The graph shown in FIG. 3A represents a fluorescence spectrum in the case of irradiating the red phosphor with light (blue light) having a peak wavelength of 450 nm, where a horizontal axis indicates a wavelength (nm) and a vertical axis indicates an intensity (normalized by an arbitrary intensity). Further, the graph shown in FIG. 3B is a graph showing an optical absorption spectrum of the red phosphor, where a horizontal axis indicates a wavelength (nm) and a vertical axis indicates an optical absorption rate (%). It is to be noted that the graph shown in FIG. 3B is obtained such that a measurement cell having a depth of 5 mm and a diameter of 15 mm is filled with the powdery red phosphor, obtained by the first manufacturing example, as densely as possible by natural dropping and tapping, and this cell filled with the red phosphor is measured by a measurement system provided with a spectro-photometer and an integrating sphere.

As shown in FIG. 3A, the red phosphor obtained by the first manufacturing example absorbs blue light and outputs red fluorescent light with a peak wavelength of 648 nm and a half width of 89 nm. Further, chromaticity coordinates of a fluorescence spectrum of the red phosphor are: (x, y)=(0.657, 0.340).

Moreover, as for the graph shown in FIG. 3B, an absolute value of wavelength dependency of an optical absorption rate (inclination of an optical absorption rate with respect to a wavelength, and the same shall apply hereinafter) of the red phosphor at a peak wavelength (558 nm) of the fluorescent light outputted by the yellow phosphor obtained by the aforementioned common manufacturing example is obtained to be 0.38%/nm. Furthermore, as for the graph shown in FIG. 3B, a ratio is obtained by dividing an optical absorption rate RAbs($\lambda$l) of the red phosphor at the aforementioned wavelength $\lambda$l by an optical absorption rate RAbs($\lambda$s) of the red phosphor at the aforementioned wavelength $\lambda$s, to be RAbs($\lambda$l)/RAbs($\lambda$s)=0.25.

[Second Manufacturing Example]

The second manufacturing example is to manufacture a red phosphor of $(Ca_{1-c}Eu_cAlSiN_3)_{1-b}(Si_2N_2O)_b$, where b=0.33 and c(1−b)=0.023.

First, 14.3 mass % of an aluminum nitride power, 8.9 mass % of an aluminum oxide powder, 48.9 mass % of an α-type silicon nitride powder, 25.0 mass % of a calcium nitride powder, and 3.0 mass % of a europium oxide powder are weighted, and then mixed using a mortar and a pestle made of a silicon nitride burned substance for not shorter than 10 minutes.

Next, the obtained powder aggregate is naturally dropped into a pot made of boron nitride having a size with a diameter of 20 mm and a height of 20 mm, to fill the pot. It is to be noted that the processes up to here (weighing, mixing and shaping of the powder materials) are performed in a globe box for holding a nitrogen atmosphere with moisture of not more than 1 ppm and oxygen of not more than 1 ppm.

The pot filled with the powder aggregate is heated in a nitrogen atmosphere of 99.999 vol % and 1 MPa by use of a graphite-resistance heating electric furnace. At this time, the temperature is increased up to 1800° C. at a programming rate of 500° C. per hour, and is further held at 1800° C. for two hours. Then, the obtained burned substance is ground by an agate-made mortar, to obtain a powdery red phosphor.

The powder of the red phosphor obtained as described above has a crystal structure where a $CaAlSiN_3$ phase with a structure of $CaAlSiN_3$ crystal is a principal phase. It is to be noted that the crystal structure was confirmed by powder X-ray diffraction (XRD) measurement using a Cu—Kα ray. Further, when the red phosphor powder was irradiated with light with a wavelength of 450 nm, output of red fluorescent light was confirmed.

Figure 4A:
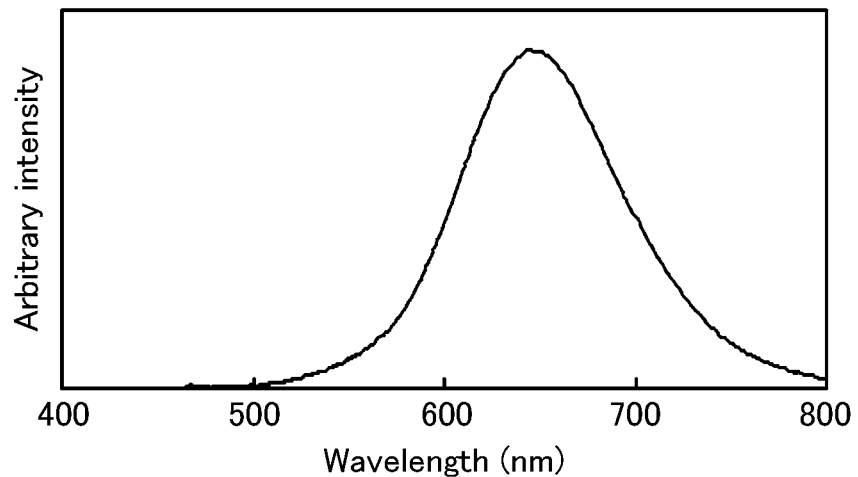
FIG. 4A and FIG. 4B comprise graphs showing properties of a red phosphor obtained by a second manufacturing example.
Figure 4B:
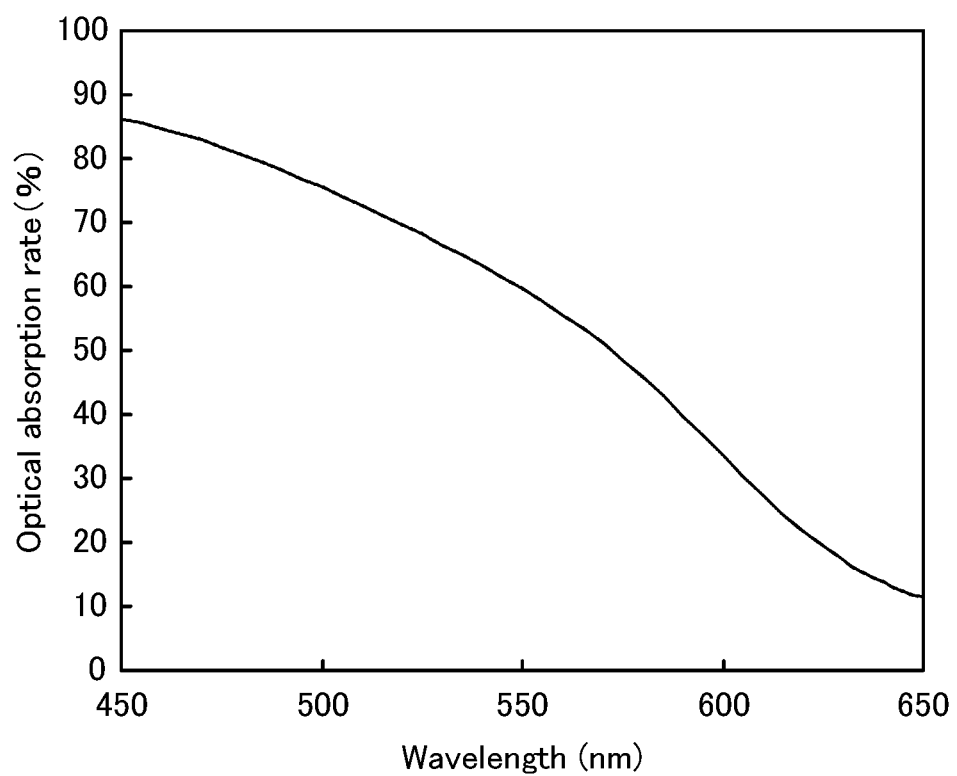

Fluorescent properties of the red phosphor obtained by the second manufacturing example will be described with reference to FIG. 4. FIG. 4 includes graphs showing properties of the red phosphor obtained by the second manufacturing example. The graph shown in FIG. 4A represents a fluorescence spectrum in the case of irradiating the red phosphor with light (blue light) having a peak wavelength of 450 nm, where a horizontal axis indicates a wavelength (nm) and a vertical axis indicates an intensity (normalized by an arbitrary intensity). Further, the graph shown in FIG. 4B is a graph showing an optical absorption spectrum of the red phosphor, where a horizontal axis indicates a wavelength (nm) and a vertical axis indicates an optical absorption rate (%). It is to be noted that the graph shown in FIG. 4B is obtained such that a measurement cell having a depth of 5 mm and a diameter of 15 mm is filled with the powdery red phosphor, obtained by the second manufacturing example, as densely as possible by natural dropping and tapping, and this cell filled with the red phosphor is measured by a measurement system provided with a spectro-photometer and an integrating sphere.

As shown in FIG. 4A, the red phosphor obtained by the second manufacturing example absorbs blue light and outputs red fluorescent light with a peak wavelength of 643 nm and a half width of 100 nm. Further, chromaticity coordinates of a fluorescence spectrum of the red phosphor are: (x, y)=(0.628, 0.369).

Moreover, as for the graph shown in FIG. 4B, an absolute value of wavelength dependency of an optical absorption rate of the red phosphor at a peak wavelength (558 nm) of the fluorescent light outputted by the yellow phosphor obtained by the aforementioned common manufacturing example is obtained, to be 0.43%/nm. Furthermore, as for the graph shown in FIG. 4B, a ratio is obtained by dividing an optical absorption rate RAbs($\lambda$l) of the red phosphor at the aforementioned wavelength $\lambda$l by an optical absorption rate RAbs($\lambda$s) of the red phosphor at the aforementioned wavelength $\lambda$s, to be RAbs($\lambda$l)/RAbs($\lambda$s)=0.24.

<Manufacturing Method for Red Phosphor (Provided in Comparative Examples of Light Emitting Device)>

For example, a $Ba_2Si_5N_8$ phosphor added with Eu as the activator, an $Sr_2Si_5N_8$ phosphor added with Eu as the activator can also be used for the red phosphor. These red phosphors are obtained for example by a first comparative manufacturing example and a second comparative manufacturing example which will be described hereinafter. It is to be noted that the first comparative manufacturing example and the second comparative manufacturing example which will be described hereinafter are capable of manufacturing the red phosphor provided in the undermentioned comparative example of the light emitting device.

[First Comparative Manufacturing Example]

The first comparative manufacturing example is to manufacture a red phosphor made up of the $Ba_2Si_5N_8$ phosphor added with Eu as the activator.

First, 44.1 mass % of an α-type silicon nitride powder, 55.5 mass % of barium nitride powder and 0.4 mass % of a europium nitride powder are weighted, and then mixed using a mortar and a pestle made of a silicon nitride burned substance for not shorter than 10 minutes. In addition, this europium nitride is obtained by performing nitridation synthesis on metal europium in ammonia.

Next, the obtained powder aggregate is naturally dropped into a pot made of boron nitride having a size with a diameter of 20 mm and a height of 20 mm, to fill the pot. It is to be noted that the processes up to here (weighing, mixing and shaping of the powder materials) are performed in a globe box for holding a nitrogen atmosphere with moisture of not more than 1 ppm and oxygen of not more than 1 ppm.

The pot filled with the powder aggregate is heated in a nitrogen atmosphere of 99.999 vol % and 1 MPa by use of a graphite-resistance heating electric furnace. At this time, the temperature is increased up to 1600° C. at a programming rate of 500° C. per hour, and is further held at 1600° C. for two hours. Then, the obtained burned substance is ground by an agate-made mortar, to obtain a powdery red phosphor.

The powder of the red phosphor obtained as described above has a crystal structure where a $Ba_2Si_5N_8$ phase with a structure of $Ba_2Si_5N_8$ crystal is a principal phase. It is to be noted that the crystal structure was confirmed by powder X-ray diffraction (XRD) measurement using a Cu—Kα ray. Further, when the red phosphor powder was irradiated with light with a wavelength of 365 nm, output of red fluorescent light was confirmed.

Figure 5A:
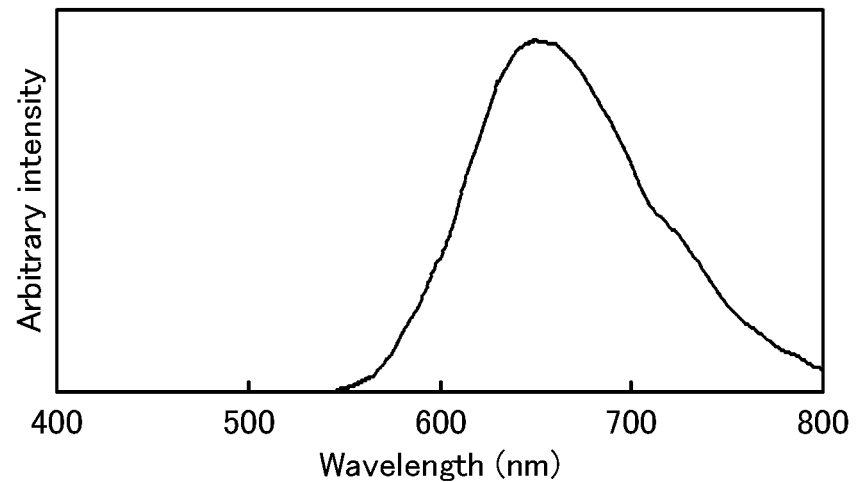
FIG. 5A and FIG. 5B comprise graphs showing properties of a red phosphor obtained by a first comparative manufacturing example.
Figure 5B:
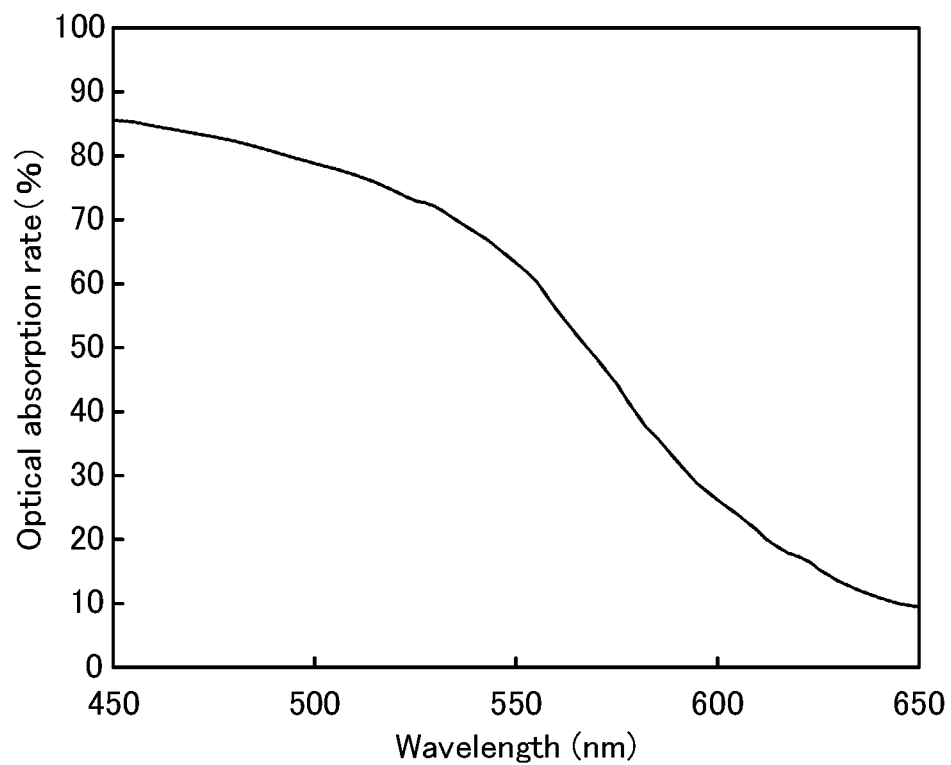

Fluorescent properties of the red phosphor obtained by the first comparative manufacturing example will be described with reference to FIG. 5. FIG. 5 includes graphs showing properties of the red phosphor obtained by the first comparative manufacturing example. The graph shown in FIG. 5A represents a fluorescence spectrum in the case of irradiating the red phosphor with light (blue light) having a peak wavelength of 450 nm, where a horizontal axis indicates a wavelength (nm) and a vertical axis indicates an intensity (normalized by an arbitrary intensity). Further, the graph shown in FIG. 5B is a graph showing an optical absorption spectrum of the red phosphor, where a horizontal axis indicates a wavelength (nm) and a vertical axis indicates an optical absorption rate (%). It is to be noted that the graph shown in FIG. 5B is obtained such that a measurement cell having a depth of 5 mm and a diameter of 15 mm is filled with the powdery red phosphor, obtained by the first comparative manufacturing example, as densely as possible by natural dropping and tapping, and this cell filled with the red phosphor is measured by a measurement system provided with a spectro-photometer and an integrating sphere.

As shown in FIG. 5A, the red phosphor obtained by the first comparative manufacturing example absorbs blue light and outputs red fluorescent light with a peak wavelength of 650 nm and a half width of 107 nm. Further, chromaticity coordinates of a fluorescence spectrum of the red phosphor are: (x, y)=(0.663, 0.337).

Moreover, as for the graph shown in FIG. 5B, an absolute value of wavelength dependency of an optical absorption rate of the red phosphor at a peak wavelength (558 nm) of the fluorescent light outputted by the yellow phosphor obtained by the aforementioned common manufacturing example is obtained, to be 0.75%/nm. Furthermore, as for the graph shown in FIG. 5B, a ratio is obtained by dividing an optical absorption rate RAbs(λl) of the red phosphor at the aforementioned wavelength λl by an optical absorption rate RAbs(λs) of the red phosphor at the aforementioned wavelength λs, to be RAbs(λl)/RAbs(λs)=0.18.

[Second Comparative Manufacturing Example]

The second comparative manufacturing example is to manufacture a red phosphor made up of the $Sr_2Si_5N_8$ phosphor added with Eu as the activator.

First, 54.3 mass % of an α-type silicon nitride powder, 45.1 mass % of strontium nitride powder and 0.6 mass % of a europium nitride powder are weighted, and then mixed using a mortar and a pestle made of a silicon nitride burned substance for not shorter than 10 minutes. In addition, this europium nitride is one obtained by performing nitridation synthesis on metal europium in ammonia.

Next, the obtained powder aggregate is naturally dropped into a pot made of boron nitride having a size with a diameter of 20 mm and a height of 20 mm, to fill the pot. It is to be noted that the processes up to here (weighing, mixing and shaping of the powder materials) are performed in a globe box for holding a nitrogen atmosphere with moisture of not more than 1 ppm and oxygen of not more than 1 ppm.

The pot filled with the powder aggregate is heated in a nitrogen atmosphere of 99.999 vol % and 1 MPa by use of a graphite-resistance heating electric furnace. At this time, the temperature is increased up to 1600° C. at a programming rate of 500° C. per hour, and is further held at 1600° C. for two hours. Then, the obtained burned substance is ground by an agate-made mortar, to obtain a powdery red phosphor.

The powder of the red phosphor obtained as described above has a crystal structure where a $Sr_2Si_5N_8$ phase with a structure of $Sr_2Si_5N_8$ crystal is a principal phase. It is to be noted that the crystal structure was confirmed by powder X-ray diffraction (XRD) measurement using a Cu—Kα ray. Further, when the red phosphor powder was irradiated with light with a wavelength of 365 nm, output of red fluorescent light was confirmed.

Figure 6A:
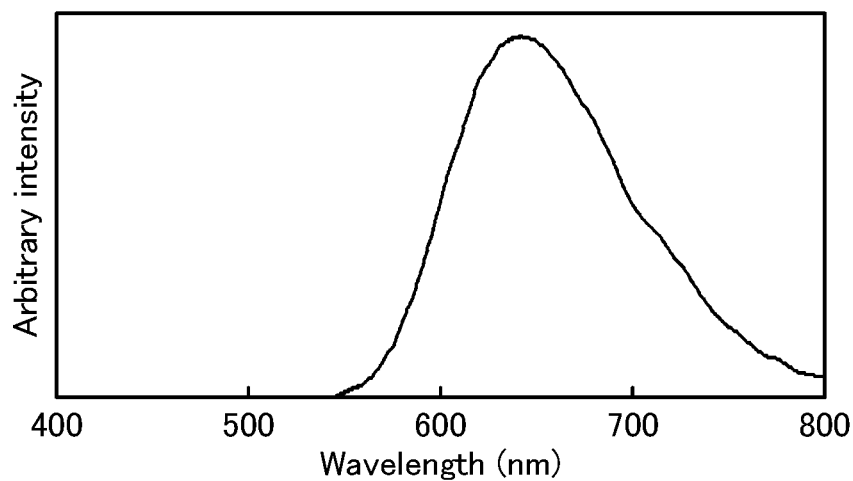
FIG. 6A and FIG. 6B comprise graphs showing properties of a red phosphor obtained by a second comparative manufacturing example.
Figure 6B:
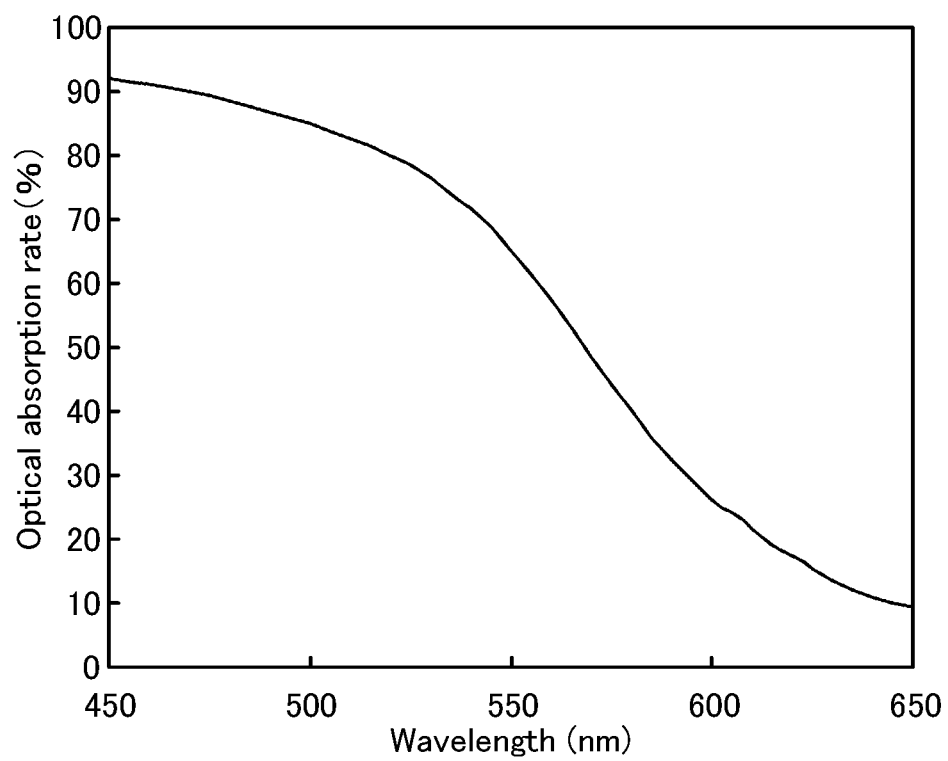

Fluorescent properties of the red phosphor obtained by the second comparative manufacturing example will be described with reference to FIG. 6. FIG. 6 includes graphs showing properties of the red phosphor obtained by the second comparative manufacturing example. The graph shown in FIG. 6A represents a fluorescence spectrum in the case of irradiating the red phosphor with light (blue light) having a peak wavelength of 450 nm, where a horizontal axis indicates a wavelength (nm) and a vertical axis indicates an intensity (normalized by an arbitrary intensity). Further, the graph shown in FIG. 6B is a graph showing an optical absorption spectrum of the red phosphor, where a horizontal axis indicates a wavelength (nm) and a vertical axis indicates an optical absorption rate (%). It is to be noted that the graph shown in FIG. 6B is obtained such that a measurement cell having a depth of 5 mm and a diameter of 15 mm is filled with the powdery red phosphor, obtained by the second comparative manufacturing example, as densely as possible by natural dropping and tapping, and this cell filled with the red phosphor is measured by a measurement system provided with a spectro-photometer and an integrating sphere.

As shown in FIG. 6A, the red phosphor obtained by the second comparative manufacturing example absorbs blue light and outputs red fluorescent light with a peak wavelength of 642 nm and a half width of 106 nm. Further, chromaticity coordinates of a fluorescence spectrum of the red phosphor are: (x, y)=(0.657, 0.343).

Moreover, as for the graph shown in FIG. 6B, an absolute value of wavelength dependency of an optical absorption rate of the red phosphor at a peak wavelength (558 nm) of the fluorescent light outputted by the yellow phosphor obtained by the aforementioned common manufacturing example is obtained, to be 0.83%/nm. Furthermore, as for the graph shown in FIG. 6B, a ratio is obtained by dividing an optical absorption rate RAbs(λl) of the red phosphor at the aforementioned wavelength λl by an optical absorption rate RAbs(λs) of the red phosphor at the aforementioned wavelength λs, to be RAbs(λl)/RAbs(λs)=0.17.

It should be noted that in the measurement of the optical absorption rates of the yellow phosphor and the red phosphor described above, as well as measurement of an optical absorption rate of a phosphor described later, there can for example be applied a measurement method described in "Absolute Fluorescent Quantum Efficiency of NBS Phosphor Standard Samples" [Ohkubo Kazuaki, et al., IEIJ (Illuminating Engineering Institute of Japan) Journal, Vol. 83 No. 2, p. 87 (1999)].

<<Examples and Comparative Examples of Light Emitting Device>>

Hereinafter, Examples 1 to 4 of the light emitting device according to the embodiment of the present invention and Comparative Examples 1 to 4 of the light emitting device will be respectively mentioned, and these light emitting devices will be described with reference to the drawings.

First, Examples 1 to 4 and Comparative Examples 1 to 4 will be described with reference to FIG. 7. FIG. 7 is a table explaining Examples 1 to 4 and Comparative Examples 1 to 4.

As shown in FIG. 7, the light emitting devices of Examples 1 and 3 each include the red phosphor obtained by the first manufacturing example, and the light emitting devices of Examples 2 and 4 each include the red phosphor obtained by the second manufacturing example. On the other hand, the light emitting devices of Comparative Examples 1 and 3 each include the red phosphor obtained by the first comparative manufacturing example, and the light emitting devices of Comparative Examples 2 and 4 each include the red phosphor obtained by the second comparative manufacturing example. Further, as shown in FIG. 7, the light emitting devices of Examples 1 and 2 each include a light source whose emitted light has a peak wavelength of 450 nm, and the light emitting devices of Examples 3 and 4 each include a light source whose emitted light has a peak wavelength of 460 nm. On the other hand, the light emitting devices of Comparative Examples 1 and 2 each include a light source whose emitted light has a peak wavelength of 450 nm, and the light emitting devices of Comparative Examples 3 and 4 each include a light source whose emitted light has a peak wavelength of 460 nm. It is to be noted that the light emitting devices of Examples 1 to 4 and Comparative Examples 1 to 4 each include the yellow phosphor obtained by the common manufacturing example. Moreover, the light emitting devices of Examples 1 to 4 and Comparative Examples 1 to 4 each include a similar light source (e.g., product name: EZR, produced by Cree, Inc.) and a similar translucent resin (e.g., product name: KER2500, produced by Shin-Etsu Chemical Co., Ltd.).

Further, the light emitting devices of Examples 1 to 4 and Comparative Examples 1 to 4 are each adjusted such that a color of emitted light is an incandescent color (e.g., such that chromaticity coordinates are: $(x, y) = (0.451$ to $0.452, 0.408$ to $0.409)$). Specifically, a mass ratio of the translucent resin constituting the mold portion to the yellow phosphor and the red phosphor and a mass ratio of the red phosphor to the yellow phosphor are adjusted in each of the light emitting devices.

Next, properties of the light emitting devices of Examples 1 to 4 and Comparative Examples 1 to 4 will be described with reference to FIGS. 8 to 10. FIG. 8 includes graphs showing properties of the light emitting devices in Examples 1 to 4. Further, FIG. 9 includes graphs showing properties of the light emitting devices in Comparative Examples 1 to 4. Moreover, FIG. 10 includes tables showing, as comparing, the properties of the light emitting devices in Examples 1 to 4 and the properties of the light emitting devices in Comparative Examples 1 to 4.

Figure 8A:
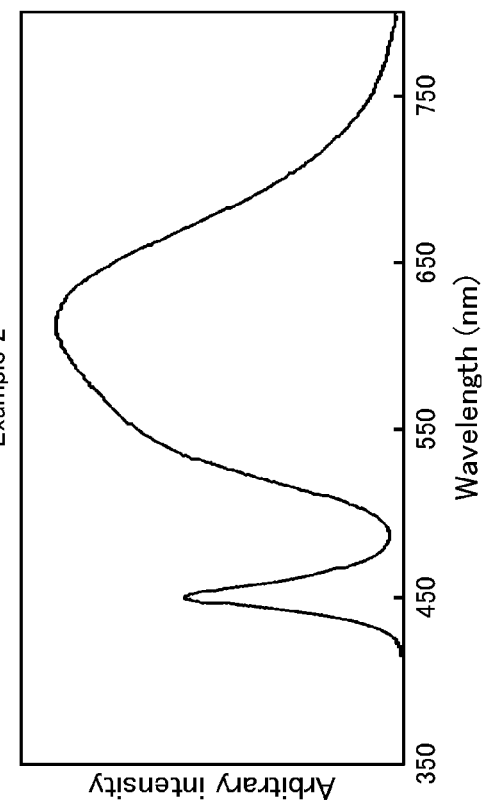
FIG. 8A through FIG. 8D comprise graphs showing properties of light emitting devices in Comparative Examples 1 to 4.
Figure 8B:
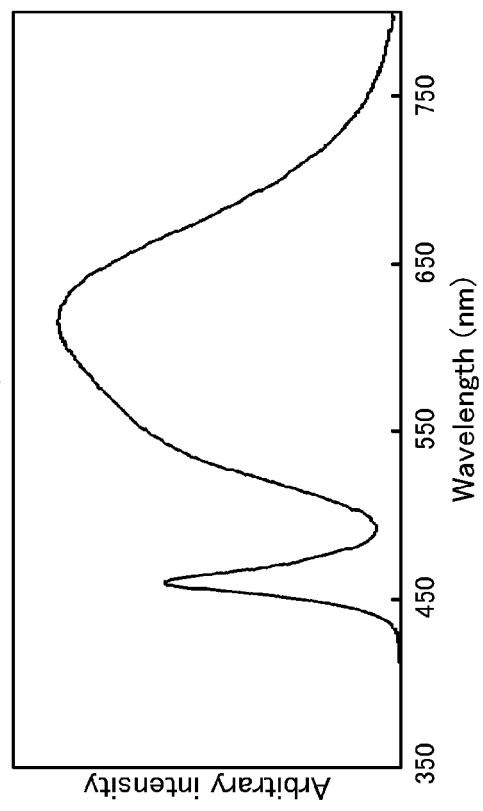
Figure 8C:
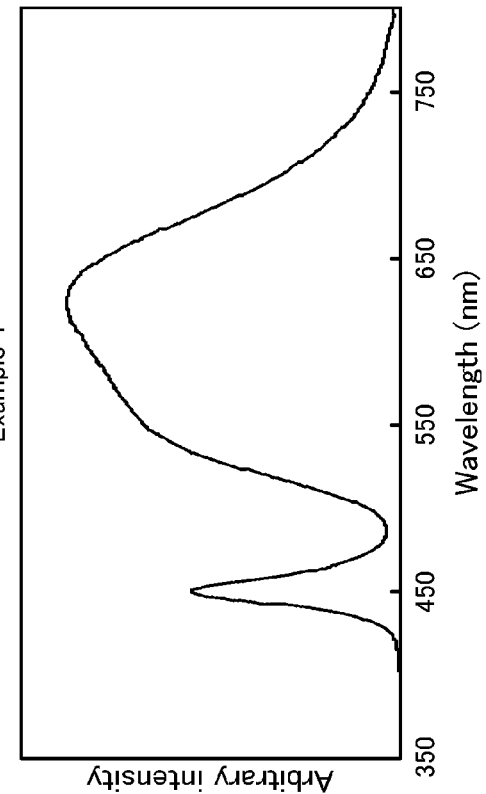
Figure 8D:
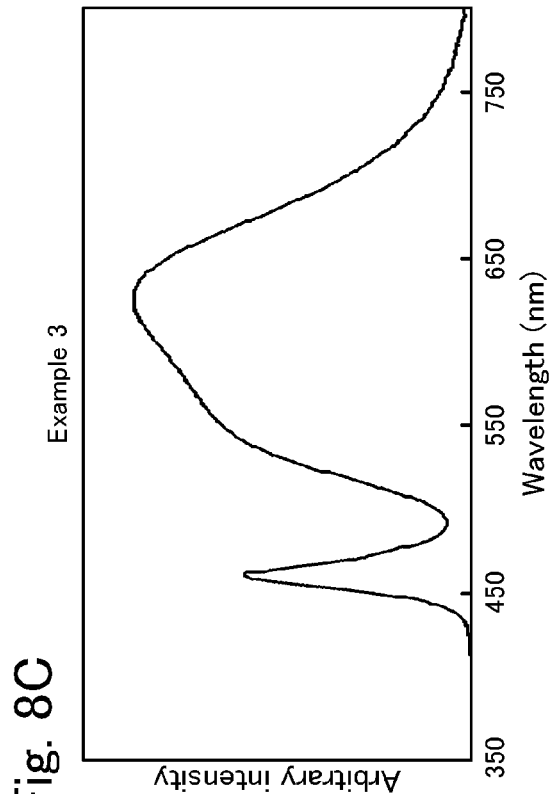

FIG. 8A is a graph showing an emission spectrum of the light emitting device of Example 1, FIG. 8B is a graph showing an emission spectrum of the light emitting device of Example 2, FIG. 8C is a graph showing an emission spectrum of the light emitting device of Example 3, and FIG. 8D is a graph showing an emission spectrum of the light emitting device of Example 4. Further, in each of the graphs of FIGS. 8A to 8D, a horizontal axis indicates a wavelength (nm) and a vertical axis indicates an intensity (normalized by an arbitrary intensity).

FIG. 9A is a graph showing an emission spectrum of the light emitting device of Comparative Example 1, FIG. 9B is a graph showing an emission spectrum of the light emitting device of Comparative Example 2, FIG. 9C is a graph showing an emission spectrum of the light emitting device of Comparative Example 3, and FIG. 9D is a graph showing an emission spectrum of the light emitting device of Comparative Example 4. Further, in each of the graphs of FIGS. 9A to 9D, a horizontal axis indicates a wavelength (nm) and a vertical axis indicates an intensity (normalized by an arbitrary intensity).

Tables shown in FIG. 10 represent properties obtained from the graphs shown in FIGS. 8 and 9. FIG. 10A is a table showing, as comparing, the properties of the light emitting devices of Examples 1 and 2 where the light source has a peak wavelength of 450 nm, and the properties of the light emitting devices of Comparative Examples 1 and 2 where the light source has a peak wavelength of 450 nm as well. Meanwhile, FIG. 10B is a table showing, as comparing, the properties of the light emitting devices of Examples 3 and 4 where the light source has a peak wavelength of 460 nm, and the properties of the light emitting devices of Comparative Examples 3 and 4 where the light source has a peak wavelength of 460 nm as well.

Each of Ra and R9 in the tables shown in FIG. 10 is a value of evaluation of color rendering properties. Ra is a general color rendering index obtained by averaging values of evaluation of color rendering properties of predetermined plurality of colors, and R9 is a special color rendering index showing a value of evaluation of red-color rendering properties. The larger the values of Ra and R9, the higher color rendering properties the values show that the light emitting device has.

Further, TCP, Duv, x and y in the tables shown in FIG. 10 represent colors of light emitted by the light emitting device. As described above, x and y are values showing chromaticity coordinates. TCP is a value showing a correlated color temperature (color temperature obtained by regarding object light as light on a black body radiation locus). Duv is a value showing a deviation between the object light and the black body radiation locus. As shown in FIG. 10, a color of light emitted from each of the light emitting devices of Examples 1 to 4 and Comparative Examples 1 to 4 is the Incandescent color.

As shown in FIG. 10A, Ra and R9 in the light emitting devices of Examples 1 and 2 are large as compared with those in the light emitting devices of Comparative Examples 1 and 2. That is, the light emitting devices of Examples 1 and 2 have higher color rendering properties and especially higher red-color rendering properties than the light emitting devices of Comparative Examples 1 and 2. Further, as shown in FIG. 10B, Ra and R9 in the light emitting devices of Examples 3 and 4 are large as compared with those in the light emitting devices of Comparative Examples 3 and 4. That is, the light emitting devices of Examples 3 and 4 have higher color rendering properties and especially higher red-color rendering properties than the light emitting devices of Comparative Examples 3 and 4.

For this reason, it is possible to make the light emitting devices of Examples 1 to 4 emit white light which is warm-color light required for example for a household illumination device and the like. In particular, the color rendering properties (Ra=82.8, R9=42.8) of the light emitting device of Example 3 even exceed color rendering properties (Ra=81, R9=26) of a three-wavelength fluorescent tube as a mainstream of indoor fluorescent lamp.

Figure 11:
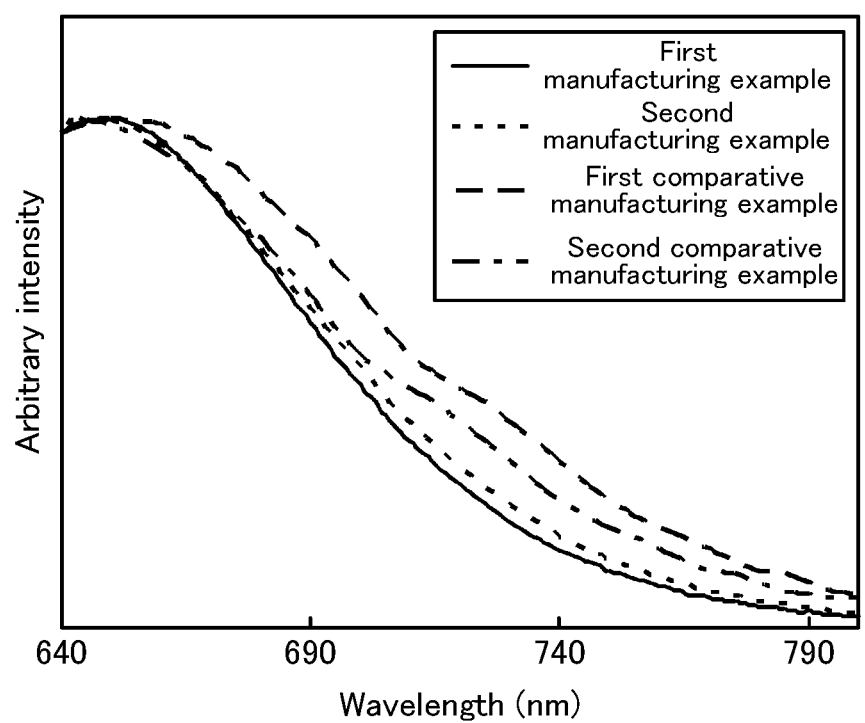
FIG. 11 is a graph showing, as comparing, properties of the red phosphors obtained respectively by the first manufacturing example, the second manufacturing example, the first comparative manufacturing example and the second comparative manufacturing example.

As described above, the light emitting devices of Examples 1 to 4 have higher color rendering properties than the light emitting devices of Comparative Examples 1 to 4. A factor of this will be described with reference to FIGS. 11 to 13. FIG. 11 is a graph showing, as comparing, properties of the red phosphors obtained respectively by the first manufacturing example, the second manufacturing example, the first comparative manufacturing example and the second comparative manufacturing example. FIG. 12 includes graphs showing the relation between wavelength dependency of an optical absorption rate of the red phosphor and color rendering properties. FIG. 13 includes graphs showing the relation between a ratio (RAbs($\lambda$l)/RAbs($\lambda$s)) of an optical absorption rate of the red phosphor and color rendering properties.

Figure 12A:
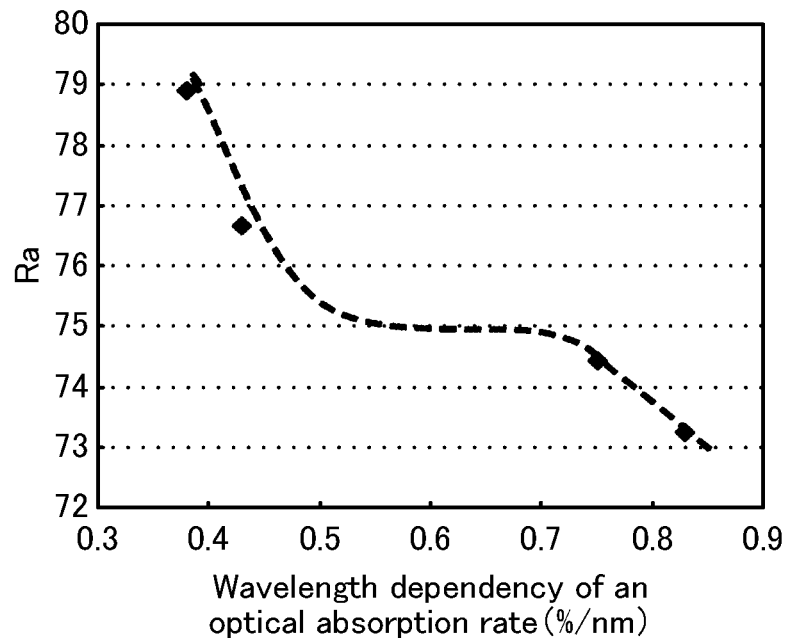
FIG. 12A and FIG. 12B comprise graphs showing the relation between wavelength dependency of an optical absorption rate of the red phosphor and color rendering properties.
Figure 12B:
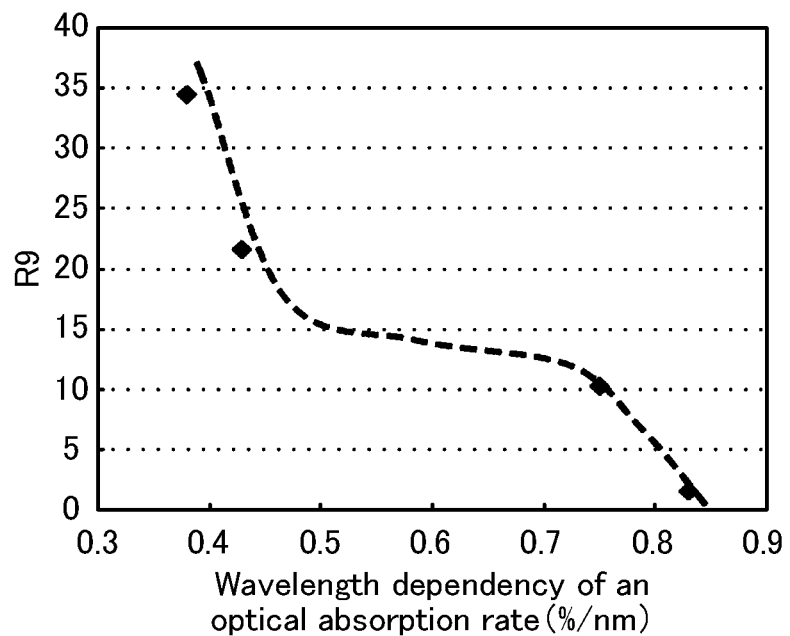
Figure 13A:
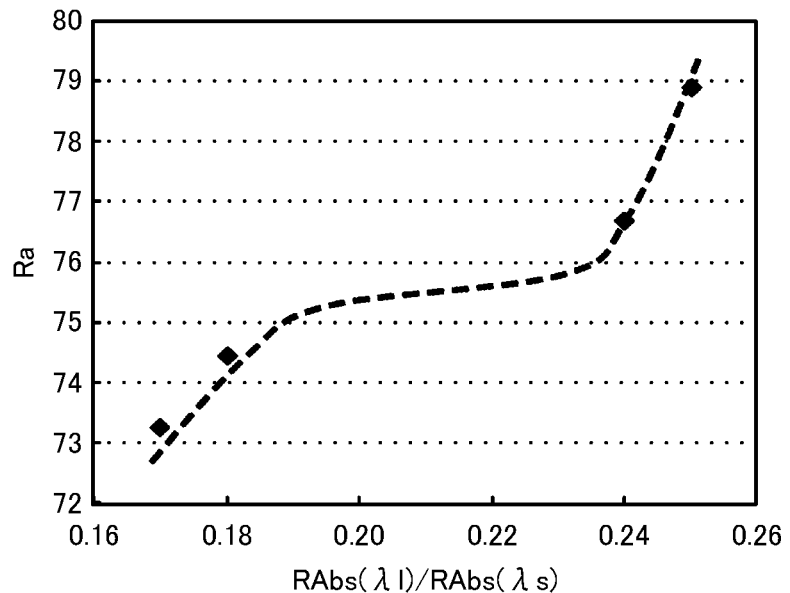
FIG. 13A and FIG. 13B comprise graphs showing the relation between a ratio of optical absorption rates (RAbs(λl)/RAbs(λs)) and the color rendering properties of the red phosphor.
Figure 13B:
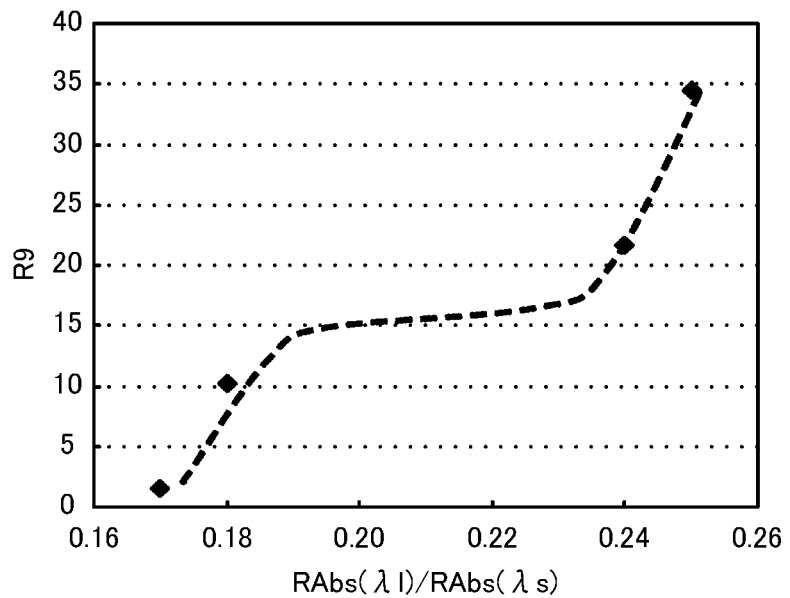

The graph shown in FIG. 11 represents each fluorescence spectrum in the case of irradiating the red phosphor, obtained by each of the first manufacturing example, the second manufacturing example, the first comparative manufacturing example and the second comparative manufacturing example, with light (blue light) having a peak wavelength of 450 nm, where a horizontal axis indicates a wavelength (nm) and a vertical axis indicates an intensity (normalized by an arbitrary intensity). FIG. 12A is a graph showing the relation between wavelength dependency set for a horizontal axis and Ra set for a vertical axis, the wavelength dependency being that of an optical absorption rate of the red phosphor at a peak wavelength of the fluorescent light outputted by the yellow phosphor, and FIG. 12B is a graph showing the relation between wavelength dependency set for a horizontal axis and R9 set for a vertical axis, the wavelength dependency being that of an optical absorption rate of the red phosphor at a peak wavelength of the fluorescent light outputted by the yellow phosphor. Further, FIG. 13A is a graph showing the relation between RAbs($\lambda$l)/RAbs($\lambda$s) set for a horizontal axis and Ra set for a vertical axis, and FIG. 13B is a graph showing the relation between RAbs($\lambda$l)/RAbs($\lambda$s) set for a horizontal axis and R9 set for a vertical axis. Moreover, the graphs shown in FIGS. 12 and 13 are obtained based on the properties of the light emitting devices of Examples 1 to 4 and Comparative Examples 1 to 4 described above.

As shown in FIG. 11, when the fluorescence spectrums of the red phosphors obtained by the first manufacturing example and the second manufacturing example are compared with the fluorescence spectrums of the red phosphors obtained by the first comparative manufacturing example and the second comparative manufacturing example, the fluorescence spectrums of the red phosphors obtained by the first comparative manufacturing example and the second comparative manufacturing example have larger long-wavelength components than the fluorescence spectrums of the red phosphors obtained by the first manufacturing example and the second manufacturing example.

In the case based on general findings (e.g. the findings of aforementioned Patent Document 1), it is considered that, the larger the long-wavelength component of the red phosphor that is used, the more the color rendering properties of light emitted by the light emitting device are improved. That is, it is considered that color rendering properties of light emitted by the light emitting devices using the red phosphors obtained by the first comparative manufacturing example and the second comparative manufacturing example are higher than those of the emitting devices using the red phosphors obtained by the first manufacturing example and the second manufacturing example.

However, as described with reference to FIG. 10, in practice, color rendering properties of light emitted by the light emitting devices using the red phosphors obtained by the first manufacturing example and the second manufacturing example are higher than those of the light emitting devices using the red phosphors obtained by the first comparative manufacturing example and the second comparative manufacturing example. This is supposed to be attributed to that the wavelength dependency of the optical absorption rate of each of the red phosphors obtained by the first manufacturing example and the second manufacturing example at the peak wavelength (558 nm) of the fluorescent light outputted by the yellow phosphor is smaller than that of each of the red phosphors obtained by the first comparative manufacturing example and the second comparative manufacturing example.

Specifically, for example, the wavelength dependency of the optical absorption rate of each of the red phosphors obtained by the first manufacturing example and the second manufacturing example as described above at the peak wavelength (558 nm) of the fluorescent light outputted by the yellow phosphor is not more than 0.5%/nm. As opposed to this, the wavelength dependency of the optical absorption rate of each of the red phosphors obtained by the first comparative manufacturing example and the second comparative manufacturing example at the peak wavelength (558 nm) of the fluorescent light outputted by the yellow phosphor is not less than 0.7%/nm.

Moreover, in the graphs showing the optical absorption spectrums shown in FIGS. 3B to 6B, in a region where the wavelength is shorter than the vicinity of 550 nm, the optical absorption rate of each of the red phosphors obtained by the first manufacturing example and the second manufacturing example is smaller than the optical absorption rate of each of the red phosphors obtained by the first comparative manufacturing example and the second comparative manufacturing example. On the other hand, in a region where the wavelength is longer than the vicinity of 550 nm, the optical absorption rate of each of the red phosphors obtained by the first manufacturing example and the second manufacturing example is larger than the optical absorption rate of each of the red phosphors obtained by the first comparative manufacturing example and the second comparative manufacturing example. That is, in a region (hereinafter referred to as a fluorescent light region) including a wavelength of fluorescent light emitted by the yellow phosphor, an optical absorption amount (an integrated value of an optical absorption rate in the fluorescent light region, and the same shall apply hereinafter) of each of the red phosphors obtained by the first manufacturing example and the second manufacturing example is substantially the same as an optical absorption amount of each of the red phosphors obtained by the first comparative manufacturing example and the second comparative manufacturing example.

As described above, the color rendering properties of the light emitting device depend not on the optical absorption amount of the red phosphor, but on the shape of the optical absorption spectrum of the red phosphor in the fluorescent light region of the yellow phosphor. Specifically, the gentler the shape of the optical absorption spectrum (the smaller the wavelength dependency of the optical absorption rate) of the red phosphor in the fluorescent light region of the yellow phosphor, the higher the color rendering properties of the light emitting device.

When the optical absorption rate of the red phosphor is large in the fluorescent light region of the yellow phosphor, it is thought based on general findings that the intensity of yellow light emitted to the outside of the light emitting device decreases to cause deterioration in color rendering properties. However, as described above, in practice, the larger the wavelength dependency of the optical absorption rate of the red phosphor in the fluorescent light region of the yellow phosphor (the wider the fluctuations of the optical absorption rate from a short wavelength to a long wavelength), the lower the color rendering properties. Therefore, the color rendering properties of the light emitting device can be effectively improved by defining the wavelength dependency of the optical absorption rate of the red phosphor in the fluorescent light region of the yellow phosphor to be small.

Here, specific conditions for improving the color rendering properties of the light emitting device will be described with reference to FIGS. 12 and 13.

First, as shown in FIG. 12, Ra and R9 showing the color rendering properties of the light emitting device abruptly increase when the absolute value of the wavelength dependency of the optical absorption rate of the red phosphor at a peak wavelength of the fluorescent light emitted by the yellow phosphor becomes not more than 0.6%/nm. That is, the color rendering properties of the light emitting device can be effectively improved by setting the absolute value of the wavelength dependency of the optical absorption rate of the red phosphor at a peak wavelength of the fluorescent light emitted by the yellow phosphor to not more than 0.6%/nm (preferably not more than 0.43%/nm, more preferably not more than 0.4%/nm).

Further, as shown in FIG. 13, Ra and R9 showing the color rendering properties of the light emitting device abruptly increase when the ratio (RAbs($\lambda$l)/RAbs($\lambda$s)) of the respective optical absorption rates of the red phosphor at the foregoing wavelengths $\lambda$s and $\lambda$l becomes larger than 0.21. That is, the color rendering properties of the light emitting device can be effectively improved by making RAbs($\lambda$l)/RAbs($\lambda$s) larger than 0.21 (more preferably larger than 0.24).

<<Optimization of Red Phosphor>>

As shown in FIG. 10, the color rendering properties (Ra and R9) are higher in Examples 1 and 3 where the red phosphor obtained by the first manufacturing example is provided than in Examples 2 and 4 where the red phosphor obtained by the second manufacturing example is provided. For, as described above, this is attributed to that the wavelength dependency of the optical absorption rate of the red phosphor obtained by the first manufacturing example is smaller than that of the red phosphor obtained by the second manufacturing example. Hereinafter, a manufacturing method for a red phosphor whose optical absorption rate has small wavelength dependency (i.e., optimization of the red phosphor) will be described with reference to the drawings.

[Third Comparative Manufacturing Example]

First, a third comparative manufacturing example will be described. The third comparative manufacturing example is to manufacture a red phosphor of $(Ca_{1-c}Eu_cAlSiN_3)_{1-b}(Si_2N_2O)_b$, where b=0.45 and c(1−b)=0.023.

In the third comparative manufacturing example, a red phosphor is obtained by applying a similar manufacturing method to those of the first and second manufacturing examples to 17.4 mass % of an aluminum nitride powder, 44.4 mass % of an α-type silicon nitride powder, 20.1 mass % of a silicon oxide powder, 20.1 mass % of a calcium nitride powder and 3.1 mass % of a europium nitride powder. The powder of the red phosphor obtained as described above has a crystal structure where a $CaAlSiN_3$ phase with a structure of $CaAlSiN_3$ crystal is a principal phase. It is to be noted that the crystal structure was confirmed by powder X-ray diffraction (XRD) measurement using a Cu—Kα ray. Further, when the red phosphor powder was irradiated with light with a wavelength of 450 nm, output of red fluorescent light was confirmed.

Figure 14:
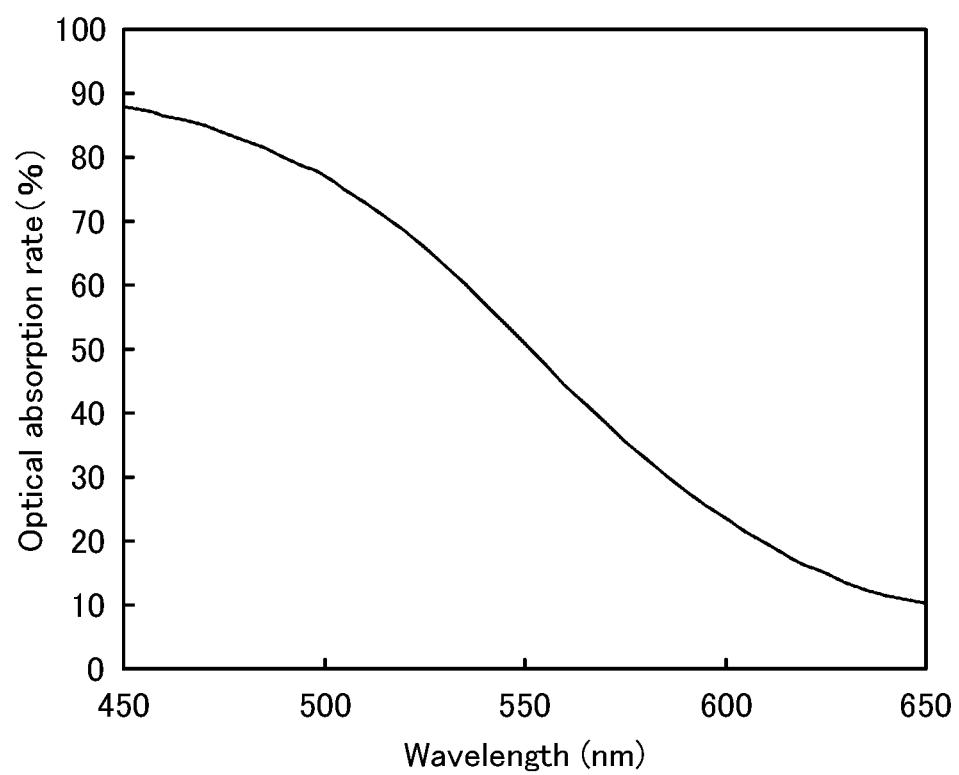
FIG. 14 is a graph showing properties of a red phosphor obtained by a third comparative manufacturing example.

Fluorescent properties of the red phosphor obtained by the third comparative manufacturing example will be described with reference to FIG. 14. FIG. 14 is a graph showing properties of the red phosphor obtained by the third comparative manufacturing example. The graph shown in FIG. 14 is a graph showing an optical absorption spectrum of the red phosphor, where a horizontal axis indicates a wavelength (nm) and a vertical axis indicates an optical absorption rate (%). It is to be noted that the graph shown in FIG. 14 is obtained such that a measurement cell having a depth of 5 mm and a diameter of 15 mm is filled with the powdery red phosphor, obtained by the third comparative manufacturing example, as densely as possible by natural dropping and tapping, and this cell filled with the red phosphor is measured by a measurement system provided with a spectro-photometer and an integrating sphere.

As for the graph shown in FIG. 14, an absolute value of wavelength dependency of an optical absorption rate of the red phosphor at a peak wavelength (558 nm) of the fluorescent light outputted by the yellow phosphor obtained by the aforementioned common manufacturing example is obtained, to be 0.62%/nm. Further, as for the graph shown in FIG. 14, a ratio is obtained by dividing an optical absorption rate RAbs($\lambda$l) of the red phosphor at the aforementioned wavelength $\lambda$l by an optical absorption rate RAbs($\lambda$s) of the red phosphor at the aforementioned wavelength $\lambda$s, to be RAbs($\lambda$l)/RAbs($\lambda$s)= 0.19.

The red phosphor obtained by the third comparative manufacturing example has a structure of $CaAlSiN_3$ crystal as do the red phosphors obtained by the first manufacturing example and the second manufacturing example. However, an absolute value of wavelength dependency of an optical absorption rate of the red phosphor at a peak wavelength (558 nm) of the fluorescent light outputted by the yellow phosphor is not less than 0.6%/nm, and RAbs($\lambda$l)/RAbs($\lambda$s) is smaller than 0.21. That is, the red phosphor does not satisfy the aforementioned conditions for effectively improving the color rendering properties of the light emitting device, and is thus difficult to apply to the light emitting device that outputs warm-color light, for example.

Figure 15A:
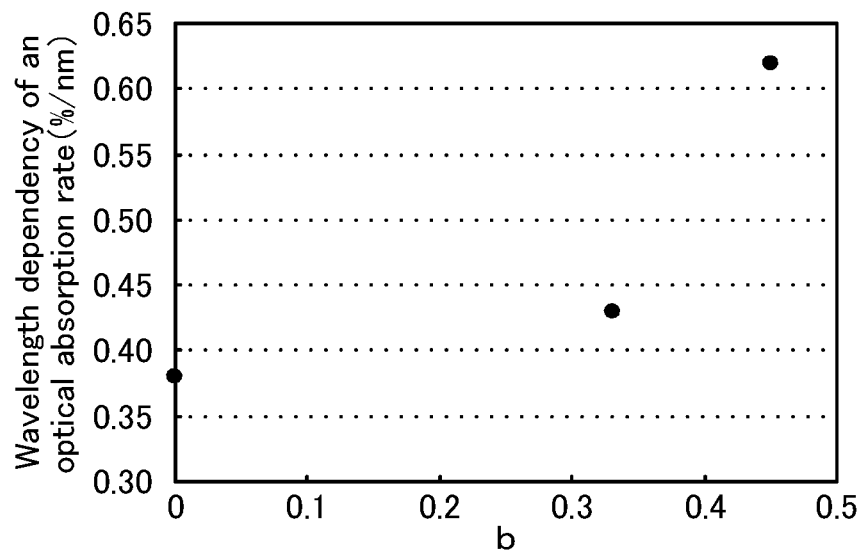
FIG. 15A and FIG. 15B comprise graphs showing the relation between a value of b and the properties of the red phosphor.
Figure 15B:
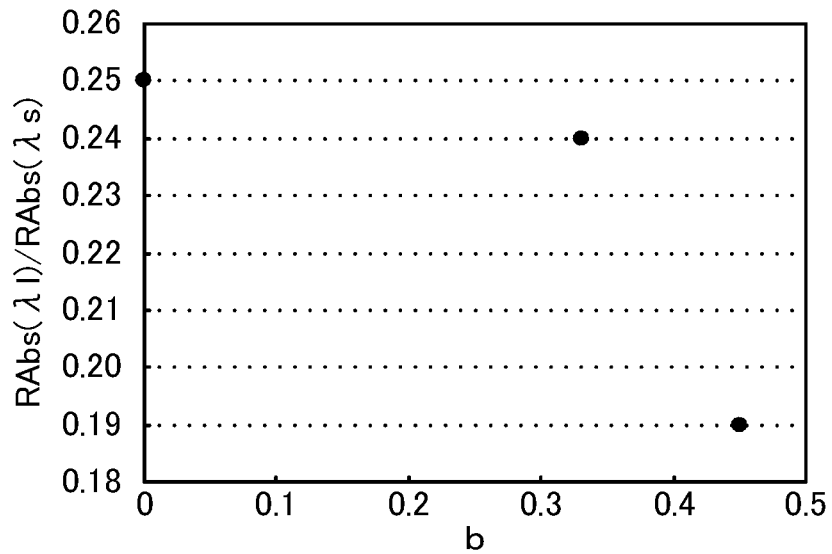

The relation between a value of b in the composition formula of $(Ca_{1-c}Eu_cAlSiN_3)_{1-b}(Si_2N_2O)_b$ of the red phosphor and properties of the red phosphor will be described with reference to FIG. 15. FIG. 15 includes graphs showing the relation between the value of b and the properties of the red phosphor. FIG. 15A is a graph showing the relation between the value of b set for a horizontal axis and wavelength dependency set for a vertical axis, the wavelength dependency being that of an optical absorption rate of the red phosphor at a peak wavelength of the fluorescent light outputted by the yellow phosphor, and FIG. 15B is a graph showing the relation between the value of b set for a horizontal axis and RAbs($\lambda$l)/RAbs($\lambda$s) set for a vertical axis. Further, the graphs shown in FIG. 15 are obtained based on the properties of the red phosphors obtained by the first manufacturing example and the second manufacturing example and the properties of the red phosphor obtained by the third comparative manufacturing example.

As shown in FIG. 15A, when the value of b is made larger than 0.4, the wavelength dependency of the optical absorption rate of the red phosphor at a peak wavelength of the fluorescent light emitted by the yellow phosphor abruptly increases.

Further, as shown in FIG. 15B, when the value of b is made larger than 0.4, the ratio (RAbs(λl)/RAbs(λs)) of the respective optical absorption rates of the red phosphor in the foregoing wavelengths λs and λl abruptly decreases.

Therefore, the color rendering properties of the light emitting device can be effectively improved by setting the value of b to not less than 0 and not more than 0.4 (preferably not more than 0.33, more preferably not more than 0.3), to make small the wavelength dependency of the optical absorption rate of the red phosphor in the fluorescent light region of the yellow phosphor.

The red phosphor with a composition formula of $(Ca_{1-c}Eu_cAlSiN_3)_{1-b}(Si_2N_2O)_b$ can dissolve oxygen to be a solid solution while keeping the crystal structure to be the structure of $CaAlSiN_3$. When the value of b increases and the solid solution amount of oxygen increases, the optical absorption properties change, to allow an increase in wavelength dependency of the optical absorption rate in the fluorescent light region of the yellow phosphor described above. Therefore, the wavelength dependency of the optical absorption rate of the red phosphor in the fluorescent light region of the yellow phosphor can be reduced by making the value of b in the above composition formula small.

<Transformation, etc.>

[1] Any light source is applicable so long as it emits the aforementioned blue light. However, from the viewpoint of light emission efficiency, it is preferable to apply a light source that emits light with a peak wavelength of not shorter than 420 nm and not longer than 480 nm. Further, from the viewpoint of making excitation efficiency of the phosphor high and making the values of Ra and R9 of the light emitting device high (improving the color rendering properties), it is particularly preferably to apply a light source that emits light with a peak wavelength of not shorter than 440 nm and not longer than 470 nm, and further a light source that emits light with a peak wavelength of not shorter than 455 nm.

[2] Although the YAG phosphor added with Ce as the activator has been illustrated as the yellow phosphor, a phosphor other than this may be applied. However, the YAG phosphor added with Ce as the activator can output yellow fluorescent light with high efficiency. Hence it is preferable to apply the YAG phosphor added with Ce as the activator to the yellow phosphor. In particular, a phosphor represented by a composition formula of $(Y_{1-d}Gd_d)_{3-e}(Al_{1-f}Ga_f)_5O_{12}Ce_e$ (0≤d≤1, 0<e≤0.2, 0≤f≤1) is preferable since its fluorescent efficiency is high and its fluorescence spectrum can be suitable for the aforementioned light emitting device. It is to be noted that, when a value of d is made large, a wavelength of fluorescent light outputted by the phosphor can be made long. Further, when a value of f is made large, the wavelength of the fluorescent light outputted by the phosphor can be made short. On the other hand, when the value of d is made larger than 0.8, the emission efficiency of the phosphor can abruptly decrease.

Although the $CaAlSiN_3$ phosphor added with Eu as the activator has been illustrated as the red phosphor, a phosphor (e.g., nitride phosphor or oxynitride phosphor) other than this may be applied. However, the $CaAlSiN_3$ phosphor added with Eu as the activator is high in fluorescent efficiency and excellent in stability of temperature properties and the like, as well as being small in wavelength dependency of the optical absorption rate in the fluorescent light region of the yellow phosphor (especially, the YAG phosphor added with Ce as the activator), as described above. Hence it is preferable to apply the $CaAlSiN_3$ phosphor added with Eu as the activator to the red phosphor.

[4] The case has been illustrated where the present invention is applied to the light emitting device including: the light source that emits blue light; the yellow phosphor that absorbs the blue light emitted by the light source and outputs yellow fluorescent light having a longer wavelength than the blue light; and the red phosphor that absorbs the blue light emitted by the light source and outputs red fluorescent light having a longer wavelength than yellow, but the present invention is applicable to a light emitting device with another structure. In particular, it is applicable to a light emitting device at least including: a light source that emits light; a first phosphor that absorbs the light emitted by the light source and outputs fluorescent light whose wavelength is longer than that of the light emitted by the light source; and a second phosphor that absorbs the light emitted by the light source and outputs fluorescent light whose wavelength is longer than that of the fluorescent light emitted by the first phosphor.

More specifically, the present invention may be applied to a light emitting device including: a light source that emits blue light; a green phosphor that absorbs the blue light emitted by the light source and outputs green fluorescent light having a longer wavelength than the blue light; and a red phosphor that absorbs the blue light emitted by the light source and outputs red fluorescent light having a longer wavelength than green. It is to be noted that the light emitted by the light source is not restricted to visible light, but may be ultraviolet light or the like. Further, the present invention may be applied to a light emitting device including three or more phosphors.

INDUSTRIAL APPLICABILITY

The light emitting device of the present invention can be suitably used for light emitting devices such as LEDs which are applied to a variety of illumination devices such as household illumination, medical illumination and vehicle light tools.

EXPLANATION OF REFERENCES

1: LIGHT EMITTING DEVICE
2: LIGHT SOURCE
3: SUBSTRATE
4: FRAME
5: MOLD PORTION
50: TRANSLUCENT RESIN
51: YELLOW PHOSPHOR
52: RED PHOSPHOR
6: ADHESIVE
7: WIRE

The invention claimed is:
1. A light emitting device comprising:
    a light source that emits light having a maximum intensity at a predetermined wavelength;
    a first phosphor that absorbs the light emitted by the light source and outputs fluorescent light having a maximum intensity at a first wavelength which is longer than the predetermined wavelength; and
    a second phosphor that absorbs the light emitted by the light source and outputs fluorescent light having a maximum intensity at a second wavelength which is longer than the first wavelength; and
    a translucent resin in which the first phosphor and the second phosphor are dispersed, wherein
    an absolute value of wavelength dependency of an optical absorption rate of the second phosphor at the first wavelength is not more than 0.6%/nm.

2. The light emitting device according to claim 1, wherein
the predetermined wavelength is not shorter than 420 nm and not longer than 480 nm,
the first wavelength is not shorter than 500 nm and not longer than 580 nm, and
the second wavelength is not shorter than 600 nm and not longer than 680 nm.

3. The light emitting device according to claim 1, wherein the absolute value of the wavelength dependency of the optical absorption rate of the second phosphor at the first wavelength is not more than 0.4%/nm.

4. The light emitting device according to claim 1, wherein
when a shorter wavelength is represented by $\lambda s$ and a longer wavelength is represented by $\lambda l$ out of wavelengths at which intensities are one-half of the intensity at the first wavelength as to the fluorescent light outputted by the first phosphor, and
an optical absorption rate of the second phosphor at a certain wavelength $\lambda$ is represented by $RAbs(\lambda)$, $RAbs(\lambda l)/RAbs(\lambda s)$ is larger than 0.21.

5. The light emitting device according to claim 4, wherein $RAbs(\lambda l)/RAbs(\lambda s)$ is larger than 0.24.

6. The light emitting device according to claim 1, wherein
the first phosphor is a YAG phosphor added with Ce as an activator, and
the second phosphor is a $CaAlSiN_3$ phosphor added with Eu as an activator.

7. The light emitting device according to claim 6, wherein a matrix of the second phosphor is represented by a composition formula of $(Ca_{1-c}Eu_cAlSiN_3)_{1-b}(Si_2N_2O)_b$.

8. The light emitting device according to claim 7, wherein a value of b in the composition formula of $(Ca_{1-c}Eu_cAlSiN_3)_{1-b}(Si_2N_2O)_b$ of the matrix of the second phosphor is not smaller than 0 and not larger than 0.4.

9. The light emitting device according to claim 2, wherein the absolute value of the wavelength dependency of the optical absorption rate of the second phosphor at the first wavelength is not more than 0.4%/nm.

10. The light emitting device according to claim 2, wherein
when a shorter wavelength is represented by $\lambda s$ and a longer wavelength is represented by $\lambda l$ out of wavelengths at which intensities are one-half of the intensity at the first wavelength as to the fluorescent light outputted by the first phosphor, and
an optical absorption rate of the second phosphor at a certain wavelength $\lambda$ is represented by $RAbs(\lambda)$, $RAbs(\lambda l)/RAbs(\lambda s)$ is larger than 0.21.

11. The light emitting device according to claim 9, wherein
when a shorter wavelength is represented by $\lambda s$ and a longer wavelength is represented by $\lambda l$ out of wavelengths at which intensities are one-half of the intensity at the first wavelength as to the fluorescent light outputted by the first phosphor, and
an optical absorption rate of the second phosphor at a certain wavelength $\lambda$ is represented by $RAbs(\lambda)$, $RAbs(\lambda)/RAbs(\lambda s)$ is larger than 0.21.

12. The light emitting device according to claim 1, wherein an optical absorption rate of the second phosphor at the first wavelength is not more than 80%.

13. The light emitting device according to claim 1, wherein a powder of the first phosphor and a powder of the second phosphor are mixed in the translucent resin.

14. A method of forming a light emitting device comprising:
providing on a substrate a light source that emits light having a maximum intensity at a predetermined wavelength;
preparing a first phosphor that absorbs the light emitted by the light source and outputs fluorescent light having a maximum intensity at a first wavelength which is longer than the predetermined wavelength; and
preparing a second phosphor that absorbs the light emitted by the light source and outputs fluorescent light having a maximum intensity at a second wavelength which is longer than the first wavelength; and
dispersing the first phosphor and the second phosphor in a translucent resin about the light source; wherein
an absolute value of wavelength dependency of an optical absorption rate of the second phosphor at the first wavelength is not more than 0.6%/nm.

* * * * *